(12) United States Patent
Teng et al.

(10) Patent No.: US 11,508,665 B2
(45) Date of Patent: Nov. 22, 2022

(54) PACKAGES WITH THICK RDLS AND THIN RDLS STACKED ALTERNATINGLY

(71) Applicant: Taiwan Semiconductor Manufacturing Co., Ltd., Hsinchu (TW)

(72) Inventors: Po-Yuan Teng, Hsinchu (TW); Kuo Lung Pan, Hsinchu (TW); Yu-Chia Lai, Zhunan Township (TW); Tin-Hao Kuo, Hsinchu (TW); Hao-Yi Tsai, Hsinchu (TW); Chen-Hua Yu, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/909,517

(22) Filed: Jun. 23, 2020

(65) Prior Publication Data
US 2021/0398905 A1 Dec. 23, 2021

(51) Int. Cl.
*H01L 23/538* (2006.01)
*H01L 23/00* (2006.01)
(Continued)

(52) U.S. Cl.
CPC ...... *H01L 23/5386* (2013.01); *H01L 21/4857* (2013.01); *H01L 23/5381* (2013.01);
(Continued)

(58) Field of Classification Search
CPC ............. H01L 23/5386; H01L 21/4857; H01L 23/5383; H01L 2224/02331;
(Continued)

(56) References Cited

U.S. PATENT DOCUMENTS 6,495,917 B1 * 12/2002 Ellis-Monaghan ..... H01L 24/12
257/758
7,363,706 B2 * 4/2008 Hirata .................. H05K 3/4652
361/792
(Continued)

FOREIGN PATENT DOCUMENTS

DE 102013114986 A1 8/2017
DE 102019118466 A1 6/2020
(Continued)

OTHER PUBLICATIONS

U.S. Appl. No. 16/656,642, filed Oct. 18, 2019.

*Primary Examiner* — Lawrence C Tynes, Jr.
(74) *Attorney, Agent, or Firm* — Slater Matsil, LLP

(57) ABSTRACT

A method includes forming a plurality of dielectric layers, which processes include forming a first plurality of dielectric layers having first thicknesses, and forming a second plurality of dielectric layers having second thicknesses smaller than the first thicknesses. The first plurality of dielectric layers and the second plurality of dielectric layers are laid out alternatingly. The method further includes forming a plurality of redistribution lines connected to form a conductive path, which processes include forming a first plurality of redistribution lines, each being in one of the first plurality of dielectric layers, and forming a second plurality of redistribution lines, each being in one of the second plurality of dielectric layers.

20 Claims, 21 Drawing Sheets

(51) Int. Cl.
*H01L 23/552* (2006.01)
*H01L 21/48* (2006.01)

(52) U.S. Cl.
CPC ........ *H01L 23/5383* (2013.01); *H01L 23/552* (2013.01); *H01L 24/16* (2013.01); *H01L 2224/023* (2013.01); *H01L 2224/0233* (2013.01); *H01L 2224/02331* (2013.01); *H01L 2224/16227* (2013.01); *H01L 2924/3025* (2013.01)

(58) Field of Classification Search
CPC ........... H01L 23/5381; H01L 2224/023; H01L 2224/0233; H01L 2224/16227; H01L 21/76801–76837; H01L 23/5329–53295
See application file for complete search history.

(56) References Cited

U.S. PATENT DOCUMENTS

| | | | | |
|---|---|---|---|---|
| 9,893,016 | B2* | 2/2018 | Sakamoto | H05K 3/4644 |
| 10,340,238 | B2* | 7/2019 | Furuichi | H01L 23/3128 |
| 10,676,351 | B2* | 6/2020 | Chen | B82B 3/008 |
| 10,784,203 | B2* | 9/2020 | Huang | H01L 24/16 |
| 10,879,199 | B2* | 12/2020 | Kuo | H01L 21/565 |
| 11,011,447 | B2* | 5/2021 | Wang | H01L 23/3736 |
| 11,057,996 | B2* | 7/2021 | Iwai | H05K 3/426 |
| 11,101,209 | B2* | 8/2021 | Liu | H01L 23/3157 |
| 2006/0105563 | A1 | 5/2006 | Zia | G02B 6/132 |
| | | | | 438/618 |
| 2008/0191354 | A1* | 8/2008 | Japp | H05K 3/4602 |
| | | | | 257/759 |
| 2009/0258161 | A1* | 10/2009 | Japp | H05K 3/4602 |
| | | | | 427/97.3 |
| 2010/0243868 | A1* | 9/2010 | Liu | H01L 27/14685 |
| | | | | 156/280 |
| 2015/0187710 | A1 | 7/2015 | Scanlan et al. | |
| 2016/0013148 | A1 | 1/2016 | Lin et al. | |
| 2016/0111378 | A1* | 4/2016 | Chen | H01L 21/4853 |
| | | | | 257/773 |
| 2017/0040256 | A1* | 2/2017 | Tsai | H01L 24/11 |
| 2017/0186732 | A1* | 6/2017 | Chu | H01L 24/82 |
| 2017/0213790 | A1* | 7/2017 | Wang | H01L 21/76804 |
| 2017/0330931 | A1* | 11/2017 | Cheng | H01L 23/5223 |
| 2018/0342455 | A1* | 11/2018 | Nosho | H01L 27/11575 |
| 2019/0131255 | A1* | 5/2019 | Teng | H01L 24/94 |
| 2019/0139812 | A1* | 5/2019 | Lin | H01L 23/53295 |
| 2019/0252351 | A1 | 8/2019 | Lin et al. | |
| 2019/0333883 | A1 | 10/2019 | Chiang et al. | |
| 2019/0363079 | A1* | 11/2019 | Thei | H01L 24/03 |
| 2020/0105663 | A1* | 4/2020 | Tsai | H01L 24/09 |
| 2020/0135453 | A1* | 4/2020 | Liu | H01L 24/14 |
| 2020/0185304 | A1* | 6/2020 | Chiu | H01L 23/3121 |
| 2020/0211922 | A1* | 7/2020 | Chun | H01L 25/16 |
| 2020/0212018 | A1* | 7/2020 | Lai | H01L 23/3121 |
| 2020/0212537 | A1* | 7/2020 | Chuang | H01Q 9/0407 |
| 2020/0243429 | A1* | 7/2020 | Lai | H01L 25/10 |
| 2020/0253037 | A1* | 8/2020 | Marin | H01L 23/49822 |
| 2020/0266136 | A1* | 8/2020 | Lee | H01L 21/76841 |
| 2021/0118787 | A1* | 4/2021 | Chen | H01L 21/481 |
| 2021/0398905 | A1* | 12/2021 | Teng | H01L 25/0655 |
| 2022/0068818 | A1* | 3/2022 | Song | H01L 23/13 |
| 2022/0093498 | A1* | 3/2022 | Chen | H01L 23/145 |

FOREIGN PATENT DOCUMENTS

| | | |
|---|---|---|
| JP | 2010141164 A | 6/2010 |
| JP | 2019041041 A | 3/2019 |
| KR | 20190038357 A | 4/2019 |
| TW | 201715670 A | 5/2017 |

* cited by examiner

US 11,508,665 B2

PACKAGES WITH THICK RDLS AND THIN RDLS STACKED ALTERNATINGLY

CROSS-REFERENCE TO RELATED APPLICATION

This application relates to commonly-assigned U.S. patent application Ser. No. 16/656,642, filed Oct. 18, 2019, and entitled "Hybrid Dielectric Scheme in Packages," which application is hereby incorporated herein by reference.

BACKGROUND

With the evolving of semiconductor technologies, some semiconductor chips/dies are becoming increasingly smaller. In the meantime, more functions need to be integrated into the semiconductor dies, which also cause other semiconductor dies and the resulting packages to become increasingly larger.

Redistribution lines are formed in the package substrates for routing power and signals in packages. With the packages become increasingly lager to accommodate more functions such Artificial Intelligence (AI) applications, the redistribution lines become very long, sometimes as long as tens of millimeters. The long redistribution lines have high resistance values, and cause significant insertion loss, especially for high-speed signals.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
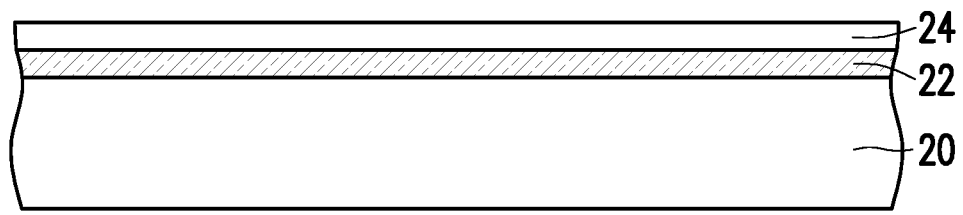
FIGS. 1 through 22 illustrate the cross-sectional views of intermediate stages in the formation of packages in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A package with thick dielectric layers and thick Redistribution Lines (RDLs) laid out alternatingly with thin dielectric layers and thin RDLs and the method of forming the same are provided in accordance with some embodiments. The intermediate stages in the formation process are also illustrated. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

Figure 27:
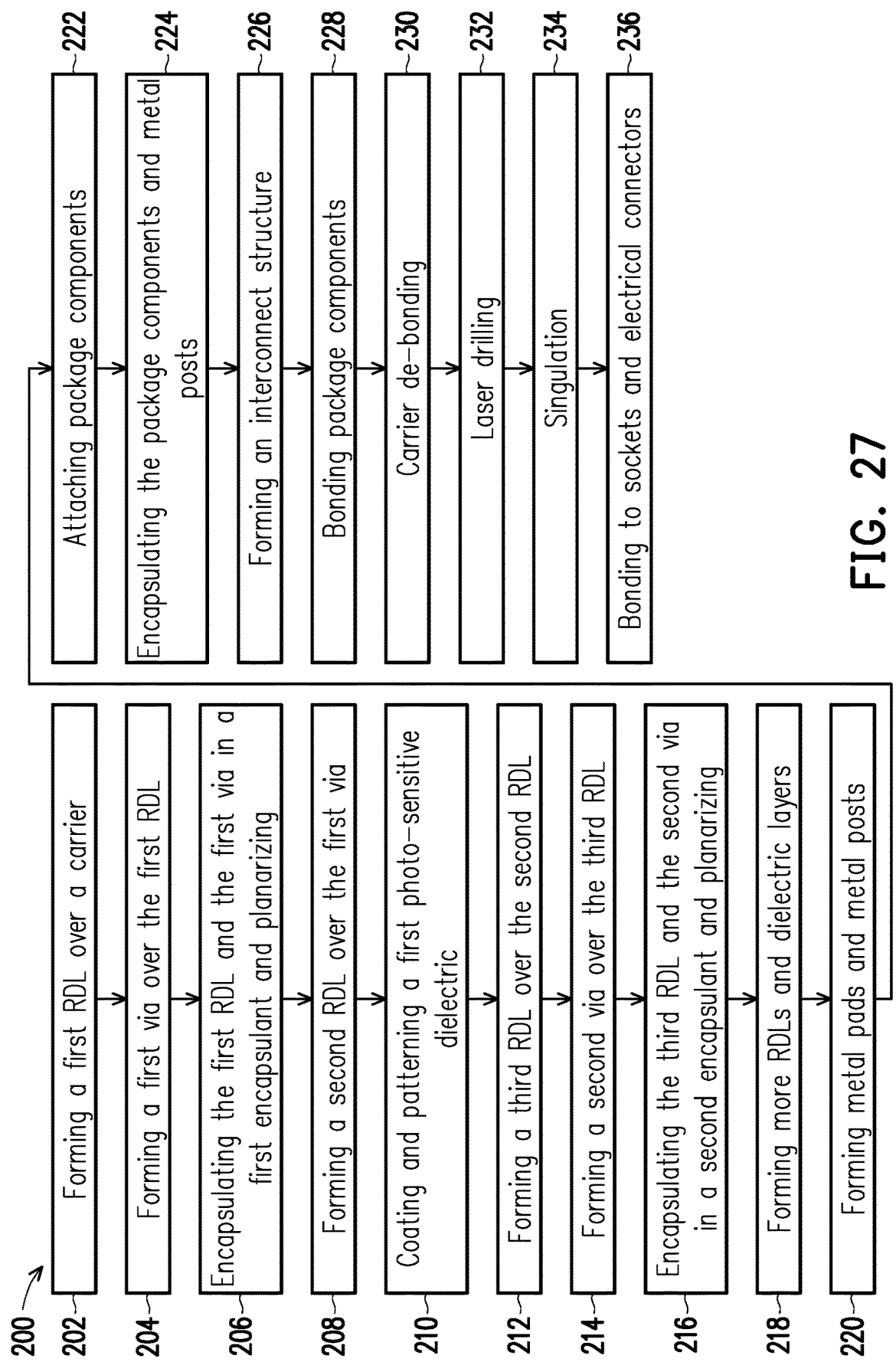
FIG. 27 illustrates a process flow for forming a package in accordance with some embodiments.

FIGS. 1 through 22 illustrate the cross-sectional views of intermediate stages in the formation of a package in accordance with some embodiments. The corresponding processes are also reflected schematically in the process flow 200 as shown in FIG. 27. Referring to FIG. 1, carrier 20 is provided, and release film 22 is coated on carrier 20. Carrier 20 is formed of a transparent material, and may be a glass carrier, a ceramic carrier, an organic carrier, or the like. Release film 22 is in physical contact with the top surface of carrier 20. Release film 22 may be formed of a Light-To-Heat-Conversion (LTHC) coating material, which is applied on carrier 20 through coating. In accordance with some embodiments of the present disclosure, the LTHC coating material is capable of being decomposed under the heat of light/radiation (such as laser), and hence can release carrier 20 from the structure formed thereon. In accordance with some embodiments, as also shown in FIG. 1, dielectric buffer layer 24 is formed on LTHC coating material 22. In accordance with some embodiments, dielectric buffer layer 24 is formed of a polymer-based material. For example, dielectric buffer layer 24 may be formed of polybenzoxazole (PBO), polyimide, benzocyclobutene (BCB), or other applicable polymers.

Figure 2:
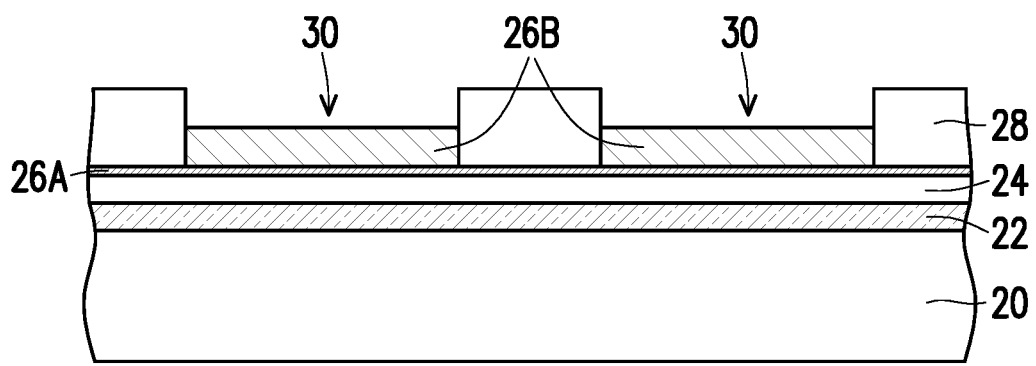
Figure 3:
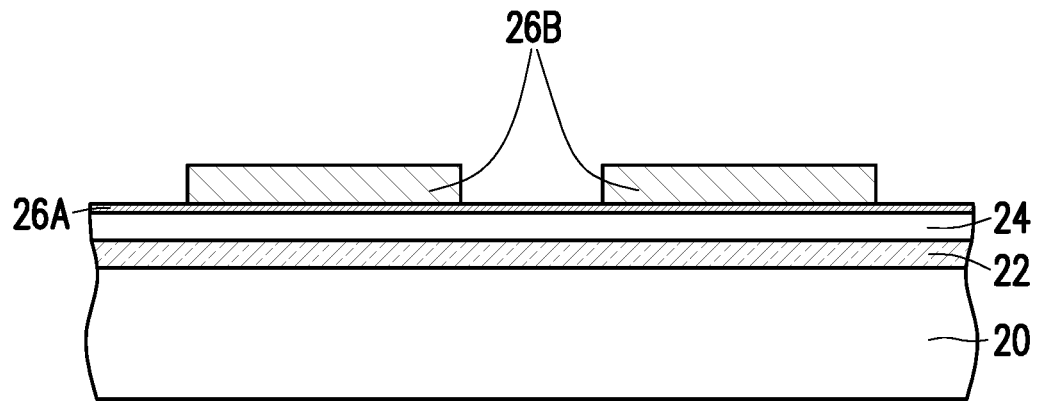

FIGS. 2 and 3 illustrate parts of the processes in the formation of Redistribution Lines (RDLs) 26 on dielectric buffer layer 24. The respective process is illustrated as process 202 in the process flow 200 shown in FIG. 27. Referring to FIG. 2, metal seed layer 26A is formed. Metal seed layer 26A is formed as a blanket layer, which may include an adhesion layer and a copper-containing layer in accordance with some embodiments. The adhesion layer may be formed of titanium, titanium nitride, tantalum, tantalum nitride, or the like. The copper-containing layer may be formed of substantially pure copper or a copper alloy. The formation methods of metal seed layer 26A may include Physical Vapor Deposition (PVD), Plasma Enhance Chemical Vapor Deposition (PECVD), Atomic Layer deposition (ALD), or the like. Patterned plating mask 28, which may be formed of photo resist or another applicable material, is then formed over metal seed layer 26A. Openings 30 are formed to expose some portions of metal seed layer 26A. Next, metal regions (RDLs) 26B are formed in openings 30, for example, through electro-chemical plating. RDLs 26B may be formed of copper or a copper alloy, aluminum, nickel, palladium, alloys thereof, or multiple layers thereof. After the formation of RDLs 26B, plating mask 28 is removed, exposing the underlying portions of metal seed layer 26A. The resulting structure is shown in FIG. 3.

Figure 4:
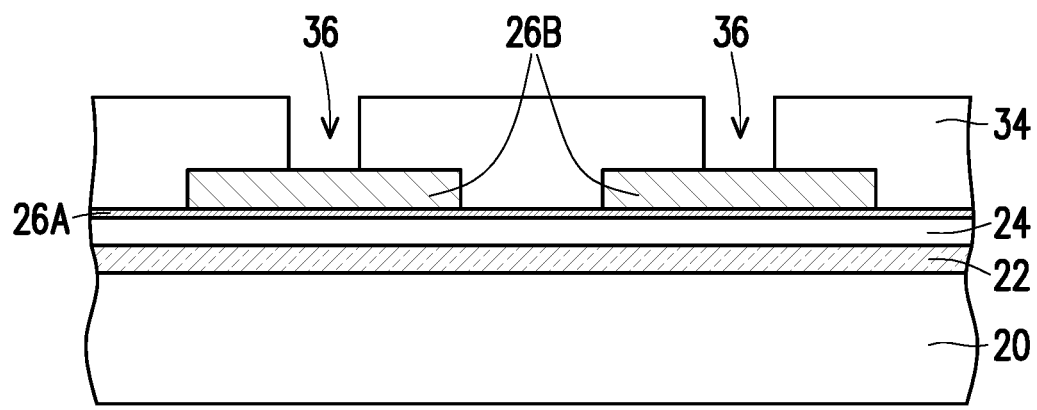
Figure 5:
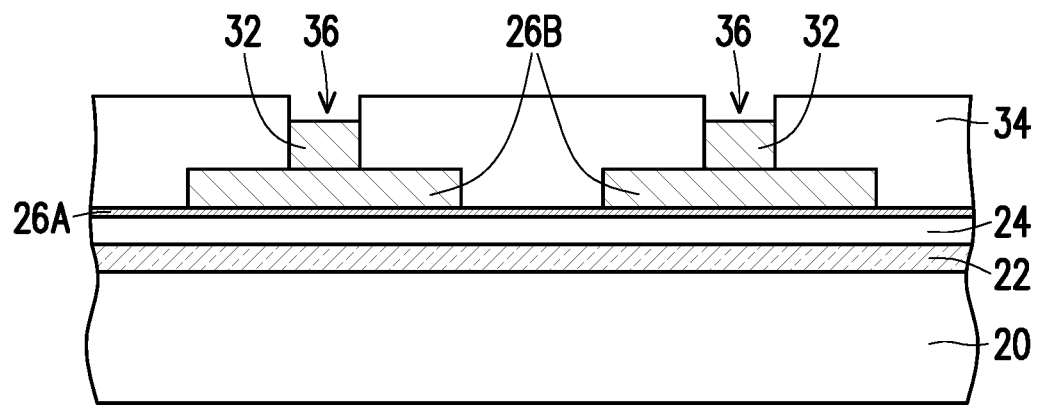
Figure 6:
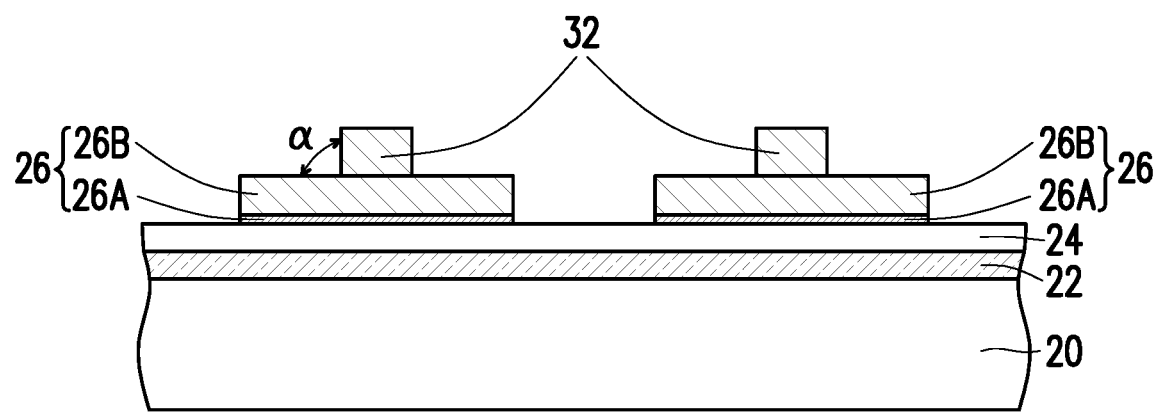

FIGS. 4 through 6 illustrate the cross-sectional views of intermediate stages in the formation of vias 32 in accordance with some embodiments of the present disclosure. The respective process is illustrated as process 204 in the process flow 200 shown in FIG. 27. The formation of vias 32 may share the same metal seed layer 26A, or may be performed using another metal seed layer. When another metal seed layer is to be used, the exposed portions of metal seed layer 26A not covered by the plated RDLs 26B are etched, followed by the formation of another metal seed layer (not shown), whose formation method and the material may be selected from the same groups of candidate methods and candidate materials of the metal seed layer 26A shown in FIG. 2. The newly formed metal seed layer covers the top surfaces and the sidewalls of RDLs 26B, and extends on the top surface of dielectric buffer layer 24.

FIG. 4 illustrates the embodiments in which metal seed layer 26A is not etched, and is used as the metal seed layer for forming vias. Patterned plating mask 34, which may be formed of photo resist, is formed, with openings 36 formed in plating mask 34 and overlapping some portions of RDLs 26.

Next, as shown in FIG. 5, vias 32 are formed in openings 36, for example, through plating. Vias 32 may be formed of copper, nickel, alloys thereof, or the like. Vias 32 and RDLs 26B may be formed of the same material or different materials, and the interfaces between vias 32 and RDLs 26B may be, or may not be, distinguishable. After the formation of vias 32, plating mask 34 is removed, exposing the underlying portions of RDLs 26B and metal seed layer 26A. Next, the exposed portions of metal seed layer 26A are etched, and the remaining portions are also denoted as 26A. The resulting structure is shown in FIG. 6. The remaining portions of metal seed layer 26A are considered as being parts of RDLs, and RDLs 26B and the remaining portions of metal seed layer 26A are collectively referred to as RDLs 26 hereinafter. Due to the plating process, the edges of vias 32 are substantially vertical and straight, for example, with tilt angle α being in the range between about 85 degrees and 90 degrees, and may be in the range between about 88 degrees and 90 degrees.

Figure 7:
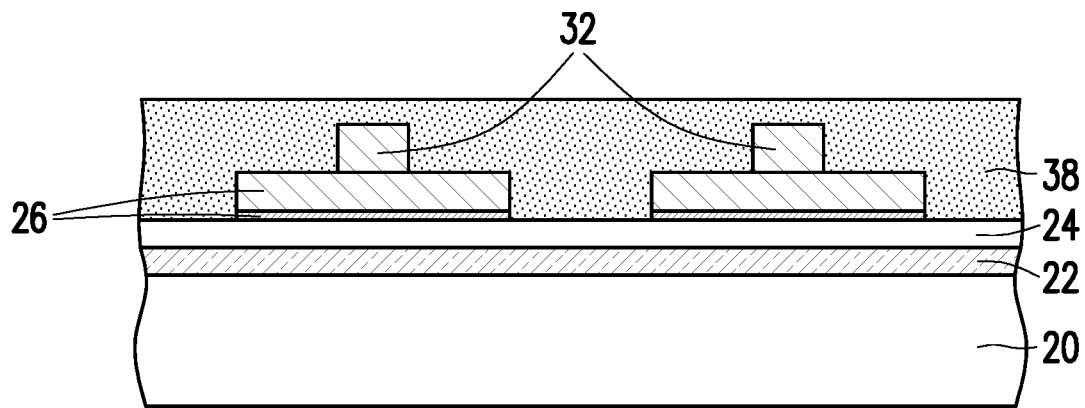

Referring to FIG. 7, dielectric layer 38 is formed to encapsulate both of RDLs 26 and vias 32 therein. The respective process is illustrated as process 206 in the process flow 200 shown in FIG. 27. Dielectric layer 38 is filled to a level higher than the top surfaces of vias 32, and is then cured. In accordance with some embodiments, dielectric layer 38 comprises or is a molding compound, a molding underfill, an epoxy, and/or a resin. The top surface of dielectric layer 38, as dispensed, is higher than the top ends of vias. When formed of molding compound or molding underfill, dielectric layer 38 may include a base material, which may be a polymer, a resin, an epoxy, or the like, and filler particles (not shown, refer to FIG. 26) in the base material. The filler particles may be dielectric particles of $SiO_2$, $Al_2O_3$, silica, or the like, and may have spherical shapes. Also, the spherical filler particles may have a plurality of different diameters. Since dielectric layer 38 may include different materials such as the base material and the filler particles, dielectric layer 38 is referred to as being formed of a heterogeneous material(s).

In accordance with alternative embodiments, dielectric layer 38 is formed of a homogenous material. The homogeneous material may be a photo-sensitive material or a non-photo sensitive material. For example, the homogeneous material may be or comprise PBO, polyimide, a resin, an epoxy, or the like. The formation process may include dispensing the homogenous dielectric layer 38 in a flowable form, and curing the dielectric layer 38. Dielectric layer 38 may also be formed of an inorganic material such as silicon oxide, silicon nitride, or the like, which may be formed by Chemical Vapor Deposition (CVD), Plasma Enhanced Chemical Vapor Deposition (PECVD), Atomic Layer Deposition (ALD), or the like.

Figure 8:
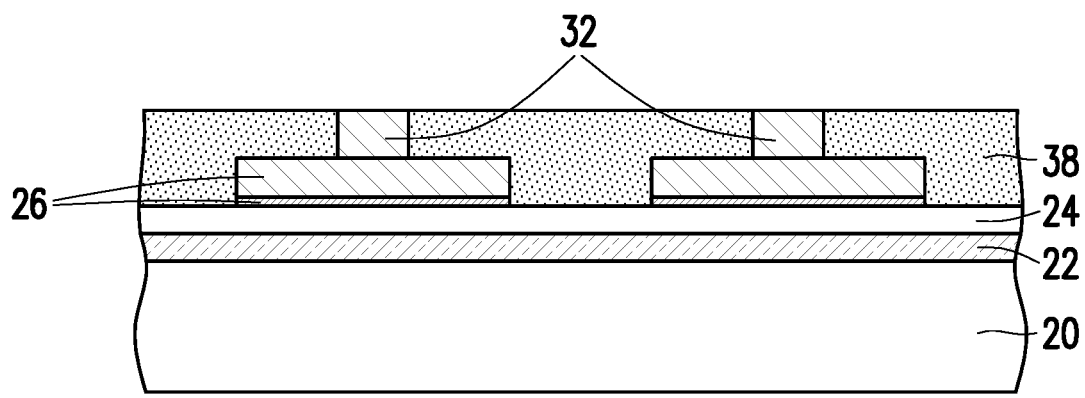

In a subsequent process, as shown in FIG. 8, a planarization process such as a Chemical Mechanical Polish (CMP) process or a mechanical grinding process is performed to planarize dielectric layer 38, until vias 32 are exposed. Due to the planarization process, the top ends of vias 32 are substantially level (coplanar) with the top surface of dielectric layer 38.

Figure 9:
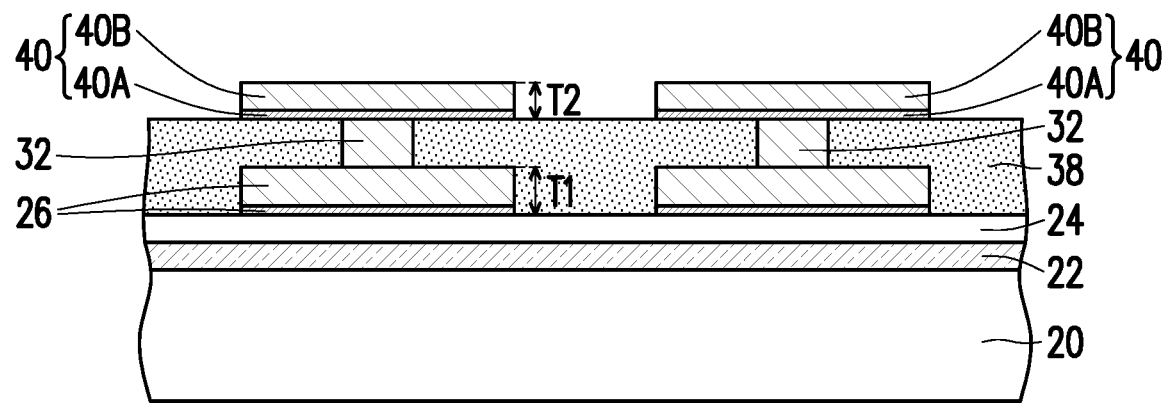

FIG. 9 illustrates the formation of RDLs 40, which may include metal seed layer 40A and the plated metal region (RDLs) 40B. The respective process is illustrated as process 208 in the process flow 200 shown in FIG. 27. In accordance with some embodiments of the present disclosure, the formation of RDLs 40 may include depositing a blanket metal seed layer, forming a patterned plating mask over the blanket metal seed layer, plating the metal regions 40B, removing the plating mask, and etching the exposed portions of the metal seed layer. The material of RDLs 40 may be selected from the same group of candidate materials for forming RDLs 26, and is not repeated herein.

Figure 10:
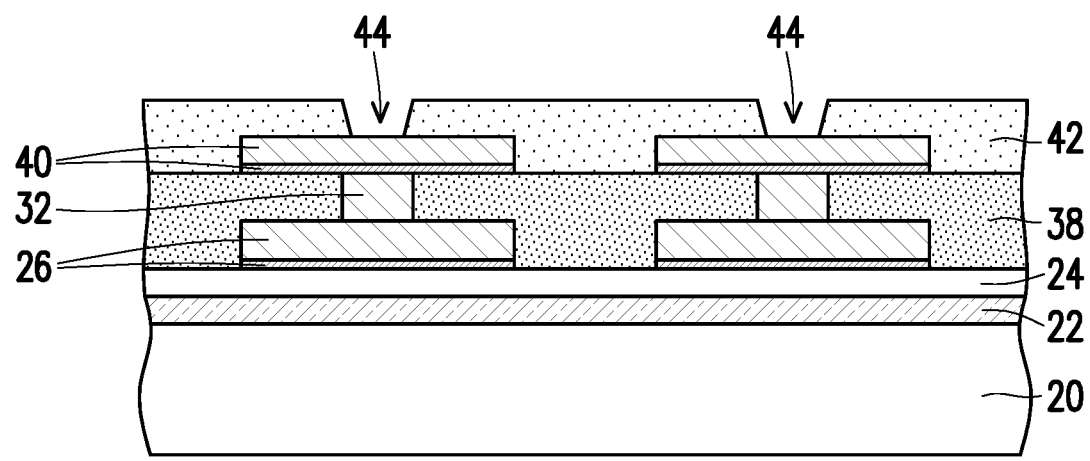

FIG. 10 illustrates the coating and the patterning of dielectric layer 42. The respective process is illustrated as process 210 in the process flow 200 shown in FIG. 27. In accordance with some embodiments, dielectric layer 42 is formed of or comprises a photo-sensitive material, and/or may be formed of or comprise a polymer formed of or comprising polyimide, PBO, or the like. Dielectric layer 42 may be dispensed in a flowable form, and is then cured. Due to the coating process, there may not be a planarization process to planarize the top surface of dielectric layer 42. Accordingly, dielectric layer 42 is overall planar, and the top surfaces of the portions of dielectric layer 42 directly over RDLs 40 may be slightly higher than the top surfaces of the portions of dielectric layer 42 aside of RDLs 40. The formation processes include coating dielectric layer 42, performing a light-exposure process on dielectric layer 42 (for example, using a patterned photo lithography mask), and developing dielectric layer 42. Some portions of dielectric layer 42 are removed in the developing process for form openings 44. Due to the formation process, the edges of openings 44 may be slanted and straight.

Figure 11:
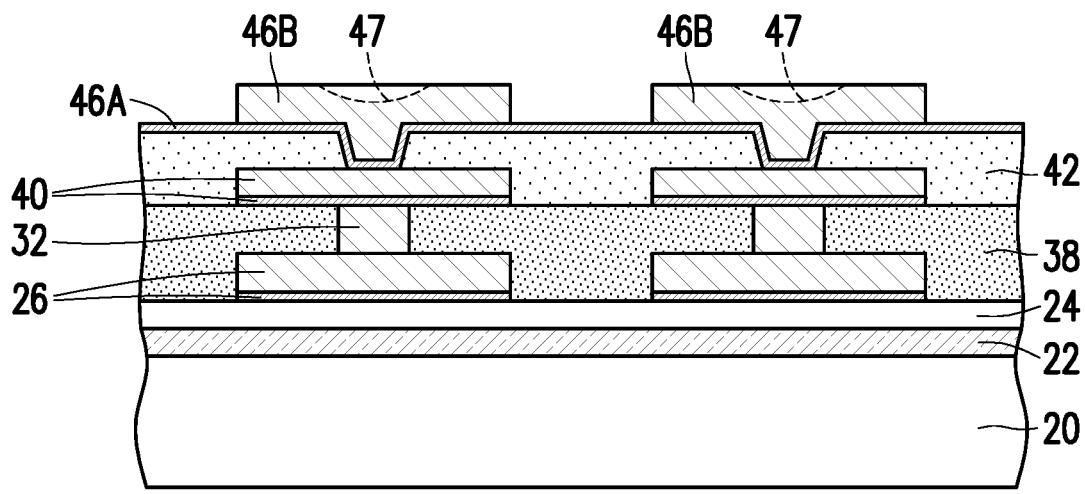

Referring to FIG. 11, metal seed layer 46A is deposited, and metal regions 46B are plated on metal seed layer 46A. The respective process is illustrated as process 212 in the process flow 200 shown in FIG. 27. Metal seed layer 26A extends into openings 44 (FIG. 10). A patterned plating mask (not shown) is then formed over metal seed layer 46A, and metal regions 46B are plated in the openings in the patterned plating mask. The plating mask is then removed, for example, through an ashing process. The portions of the metal seed layer 46A that were previously covered by the plating mask may be left as the metal seed layer for forming vias thereon, or may be etched at this time. The material of the plated metal regions 46B may be selected from the same group of candidate materials used for forming plated metal regions 26B, and is not repeated herein.

Figure 12:
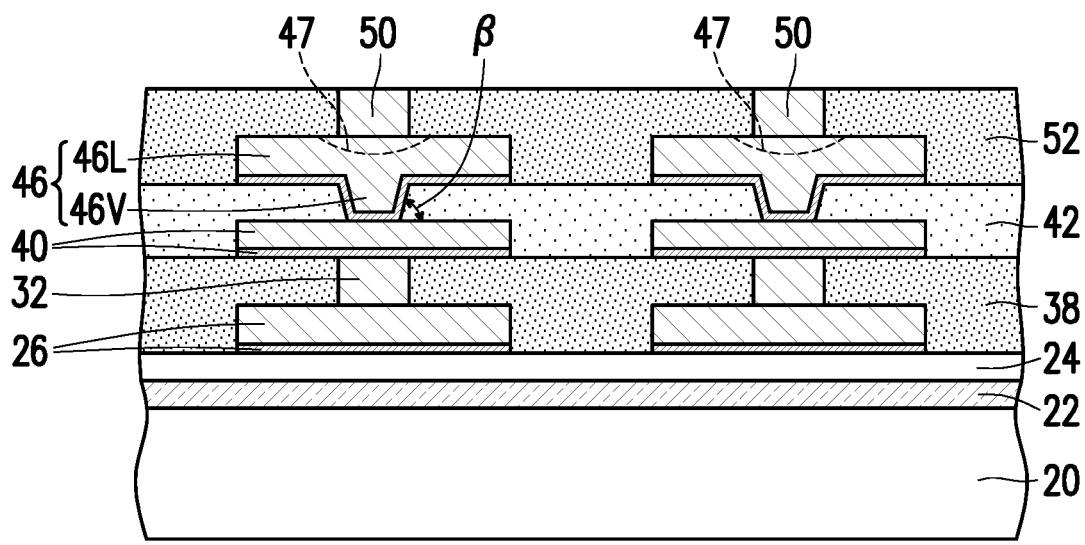

FIG. 12 illustrates the formation of vias 50, which may be plated using metal seed layer 46A as its seed layer, or may be formed by using a separate metal seed layer. The respective process is illustrated as process 214 in the process flow 200 shown in FIG. 27. In accordance with some embodiments, the formation processes for forming vias 50 include forming a patterned plating mask (not shown), plating vias 50, removing the plating mask, and etching the exposed portions of the metal seed layer (46A or the additionally formed metal seed layer). The material of vias 50 may be selected from the same group of candidate materials (such as copper, nickel, or alloys thereof) used for forming vias 32, and hence are not repeated herein. Vias 50 and the plated metal regions 46B may be formed of the same material or different materials, and the interfaces between vias 50 and the plated metal regions 46B may be, or may not be, distinguishable. Throughout the description, plated metal regions 46B (FIG. 11) and the remaining portions of metal seed layer 46A are collectively referred to as RDLs 46.

As shown in FIG. 12, RDLs 46 include line portions 46L, which are over dielectric layer 42, and via portions 46V, which extend into dielectric layer 42. In accordance with some embodiments of the present disclosure, some portions of the top surfaces of RDLs 46 directly over vias 46V may be recessed due to the topology caused by openings 44. The recessed top surfaces of RDLs 46 are illustrated by dashed lines 47 in accordance with some example embodiments. In accordance with other embodiments, the plating process is adjusted so that the top surfaces of the line portions 46L directly over via portions 46V are planar or even higher than the top surfaces of the portions of line portions 46L overlapping dielectric layer 42. Due to the formation process, the edges of vias 46V are slanted, for example, with tilt angle β being smaller than about 85 degrees, or smaller than about 80 degrees or about 75 degrees.

As shown in FIGS. 10 and 11, since dielectric layer 42 may be formed of a homogenous material, it is possible to pattern dielectric layer 42 (as shown in FIG. 10) to form openings 44. Line portions 46L and via portions 46V thus can be formed in a same process. As a comparison, since dielectric layer 38 may be heterogeneous, and the base material and the filler particles therein have different etching rates, it is difficult to etch dielectric layer 38. Accordingly, vias 32 and RDLs 40 may be formed in separate processes, which result in the increase in the manufacturing cost. The increased cost, however, is compensated for by the benefit of being able to adjust the thickness of dielectric layer 38 to have a desirable value, which may be greater than 15 μm, and may be in the range between about 150 μm and about 80 μm. As a comparison, when dielectric layer 42 is formed of a photo-sensitive material, due to the limitation of the exposure, the thickness of dielectric layer 42 is limited, for example, to be smaller than about 15 μm.

Next, as also shown in FIG. 12, dielectric layer 52 is formed to encapsulate RDL line portions 46L and vias 50 therein. The respective process is illustrated as process 216 in the process flow 200 shown in FIG. 27. Dielectric layer 52 may be formed of a material selected from the same candidate materials for forming dielectric layer 38, and may be formed of or comprise a molding compound, a molding underfill, an epoxy, a resin, an inorganic dielectric material, or the like. A planarization process such as a CMP process or a mechanical grinding process is then performed to planarize dielectric layer 52 until vias 50 are exposed. The respective process is also illustrated as process 216 in the process flow 200 shown in FIG. 27. Due to the planarization process, the top ends of vias 50 are level (coplanar) with or substantially level with the top surface of dielectric layer 52.

Figure 13:
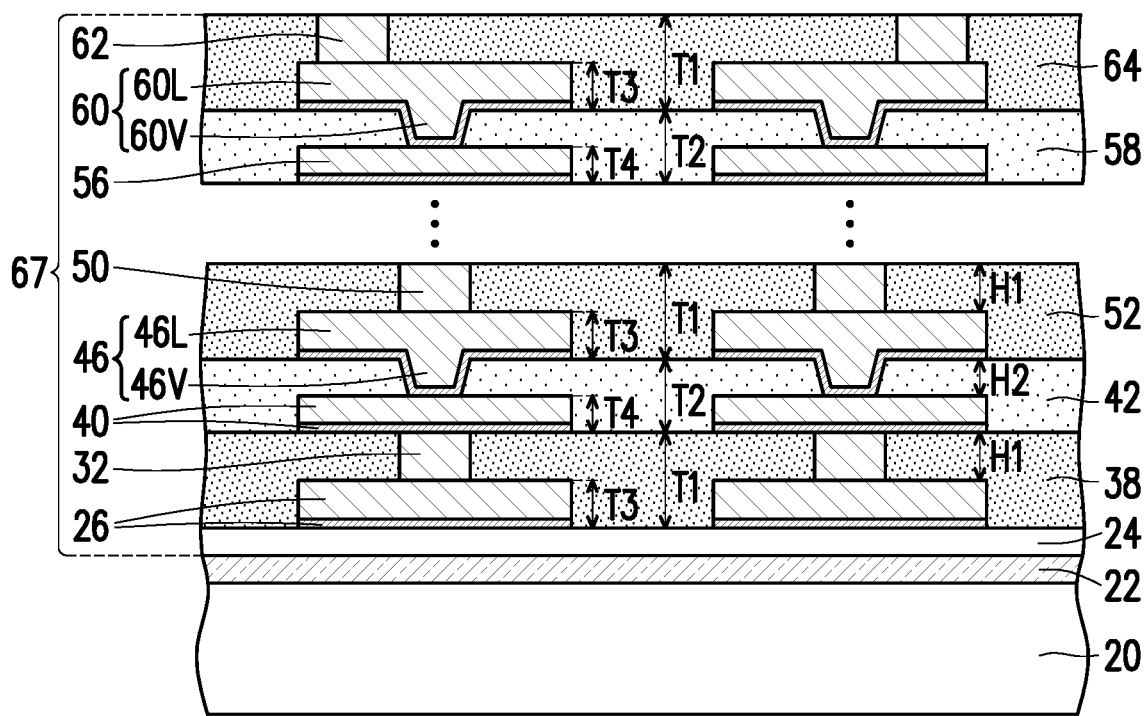

FIG. 13 illustrates the formation of more overlying features including RDLs 56 and 60, vias 62, and dielectric layers 58 and 64. The respective process is illustrated as process 218 in the process flow 200 shown in FIG. 27. Some of the overlying layers, which are represented by dots, may represent the layered structure similar to the structure including dielectric layers 42 and 52 and the conductive features 40, 46 and 50. The conductive features in the overlying structures may also adopt the structures of RDLs 40 and 46 and vias 50.

In accordance with some embodiments, dielectric layer 38, 42, 52, 58, and 64, and the dielectric layers between dielectric layers 52 and 58 collectively adopt an alternating layout, with some of the layers formed of homogenous materials, and are thinner with thicknesses T2, and other layers formed of heterogeneous materials, and are thicker with thicknesses T1, which are greater than thicknesses T2. Each layer formed of a homogenous material may be inserted between, and contacting, two layers formed of heterogeneous materials, and each layer formed of a heterogeneous material may be inserted between, and contacting, two layers formed of homogenous materials. For example, layers 42 and 58 may be formed of homogenous materials, while layers 38, 52, and 64 may be formed of heterogeneous materials. Dielectric layers 38, 52, and 64 may be formed of the same material as, or different materials from, dielectric layers 42 and 58. For example, dielectric layer 38, 42, 52, 58, and 64 may all be formed of or comprise molding compound or molding underfill, or all be formed of polyimide, PBO, or the like. Alternatively, dielectric layers 38, 52, and 64 may be formed of molding compound, molding underfill, or the like while dielectric layers 42 and 58 may be formed of PBO, polyimide, or the like.

In accordance with some embodiments, the ratio T1/T2, which is the ratio of the thickness of the thicker dielectric layers to the thickness of the thinner dielectric layers, is greater than about 1.5, and may be in the range between about 1.5 and 10, and may further be in the range between about 2 and 5. For example, thickness T1 of the thicker dielectric layers 38, 52, and 64, etc. may be in the range between about 10 μm and about 80 μm, and thickness T2 of thinner dielectric layers 24, 42, and 58 may be in the range between about 4 μm and about 25 μm.

The thickness T3 of the RDLs (such as 26, 46L, and 60L) in the thicker dielectric layers 38, 52, and 64 are greater than the thickness T4 of the RDLs (such as 40 and 56) in the thinner dielectric layers (such as 42 and 58). In accordance with some embodiments, the ratio T3/T4 is greater than about 1.5, and may be in the range between about 1.5 and about 10, and may further be in the range between about 2 and about 5. For example, thickness T3 may be in the range between about 5 μm and about 40 μm, and thickness T4 may be in the range between about 1 μm and about 10 μm. Throughout the description, all of the redistribution lines and dummy metal pads at a same level are collectively referred to as a redistribution layer or an RDL layer.

In addition, the heights H1 of the vias (such as 32, 50, and 62) in the thicker dielectric layers 38, 52, and 64 are greater than the thickness H2 of the vias (such as 46V and 60V) in the thinner dielectric layers (such as 42 and 58). In accordance with some embodiments, the ratio H1/H2 is greater than about 1.5, and may be in the range between about 1.5 and 10, and may further be in the range between about 2 and 5. For example, Height H1 may be in the range between about 5 μm and about 40 μm, and height H2 may be in the range between about 3 μm and about 15 μm.

Figure 21:
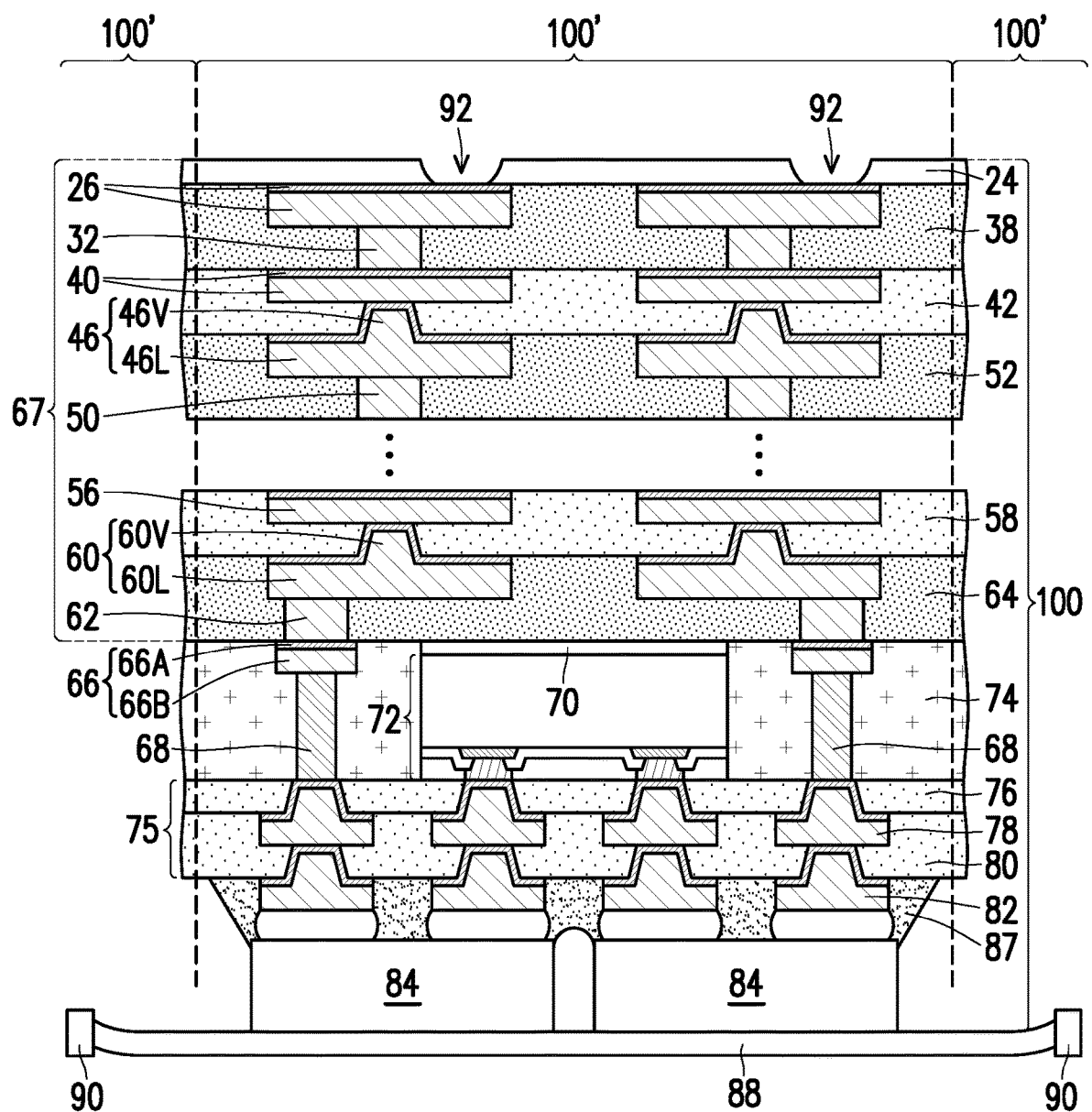

Throughout the description, the features over release film 22 are collectively referred to as interconnect structure 67. In accordance with some embodiments, a probing process is performed to probe the function of the interconnect structure 67. Interconnect structure 67 includes a plurality of identical parts (dies), which may be sawed apart from each other in subsequent processes (FIG. 21). These dies may be probed, for example, using a probe card, and the electrically connections in interconnect structure 67 are measured to determine whether the dies are defective or not. The defective dies are not used for subsequent bonding process, and no device dies will be placed directly on the defective dies.

Figure 14:
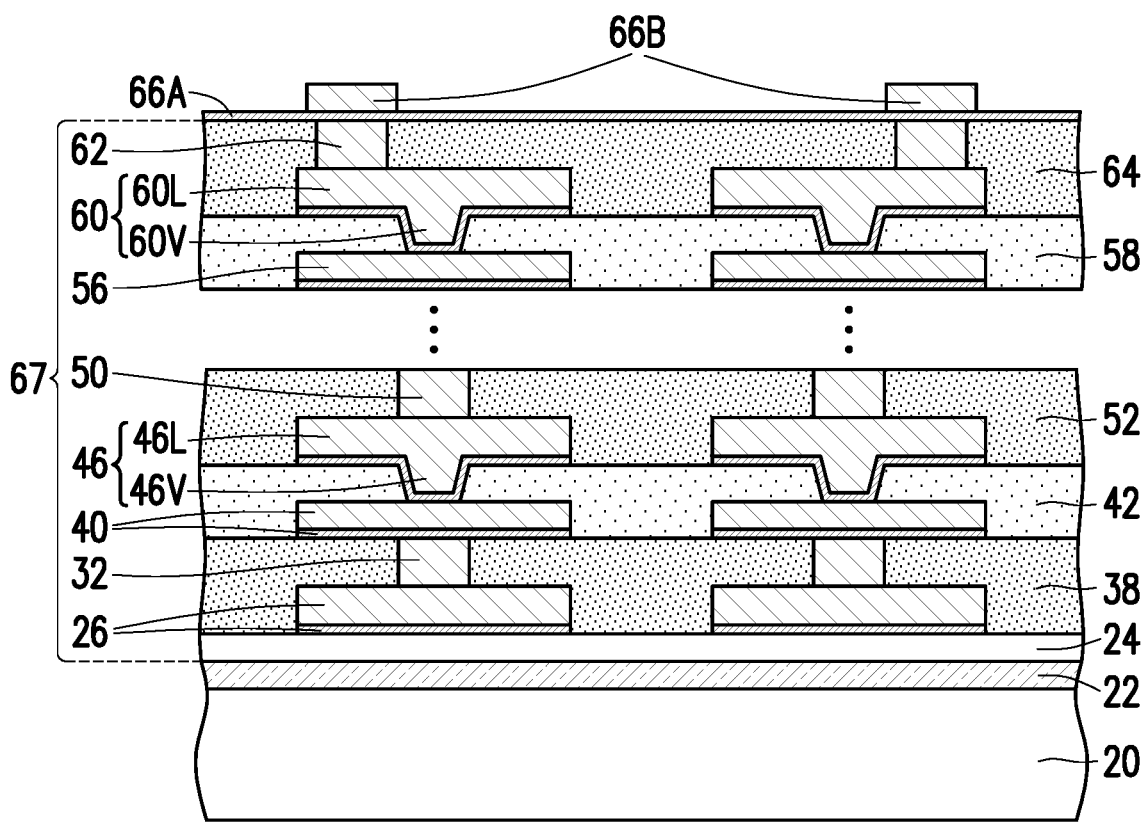
Figure 15:
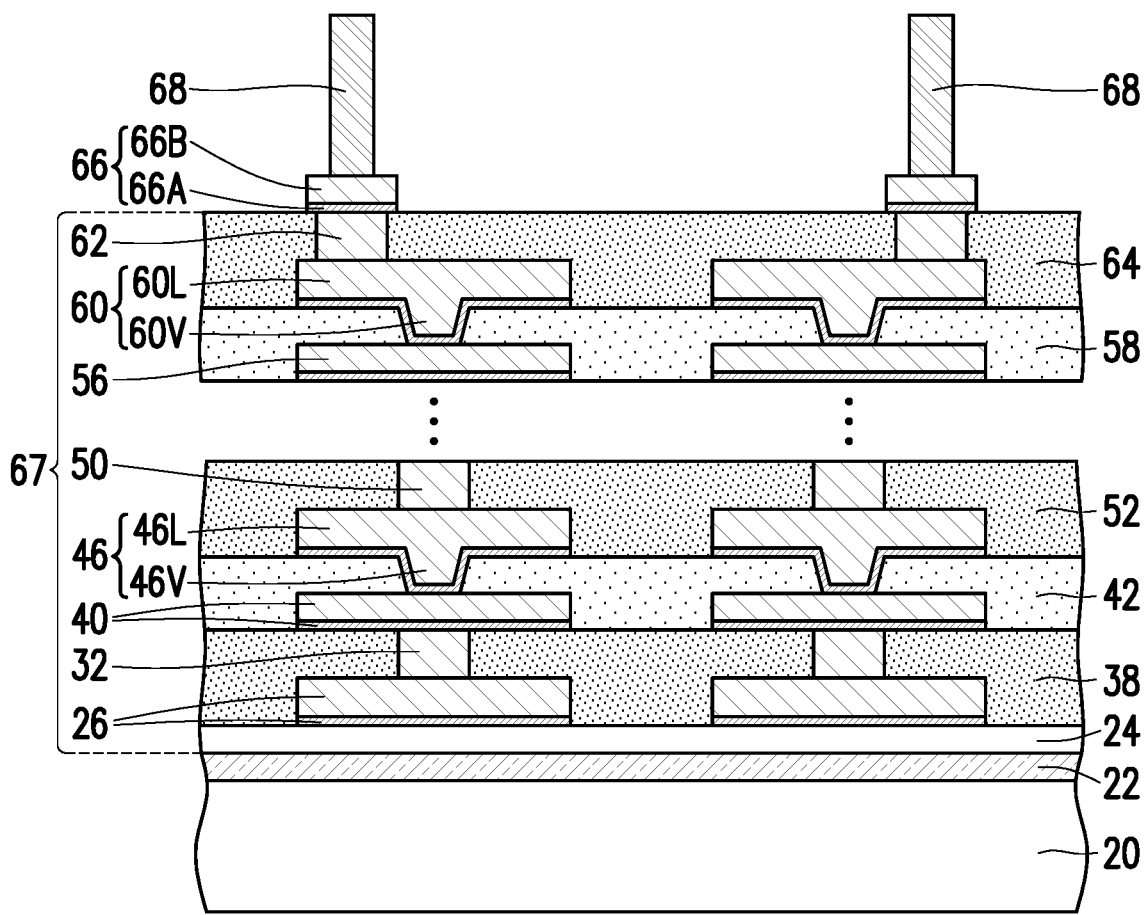

FIGS. 14 and 15 illustrate the formation of RDLs 66 (which are also metal pads) and metal posts 68 over and electrically connecting to interconnect structure 67. The respective process is illustrated as process 220 in the process flow 200 shown in FIG. 27. The process may include depositing metal seed layer 66A, forming a first plating mask (not shown) to plate RDLs 66B, removing the first plating mask, forming a second plating mask (not shown), plating metal posts 68, removing the second plating mask, and stripping the portions of the metal seed layer 66A not covered by RDLs 66B. The plated RDLs 66B and remaining portions of the metal seed layer 66A are collectively referred to as RDLs 66 hereinafter, which are shown in FIG. 15.

Figure 16:
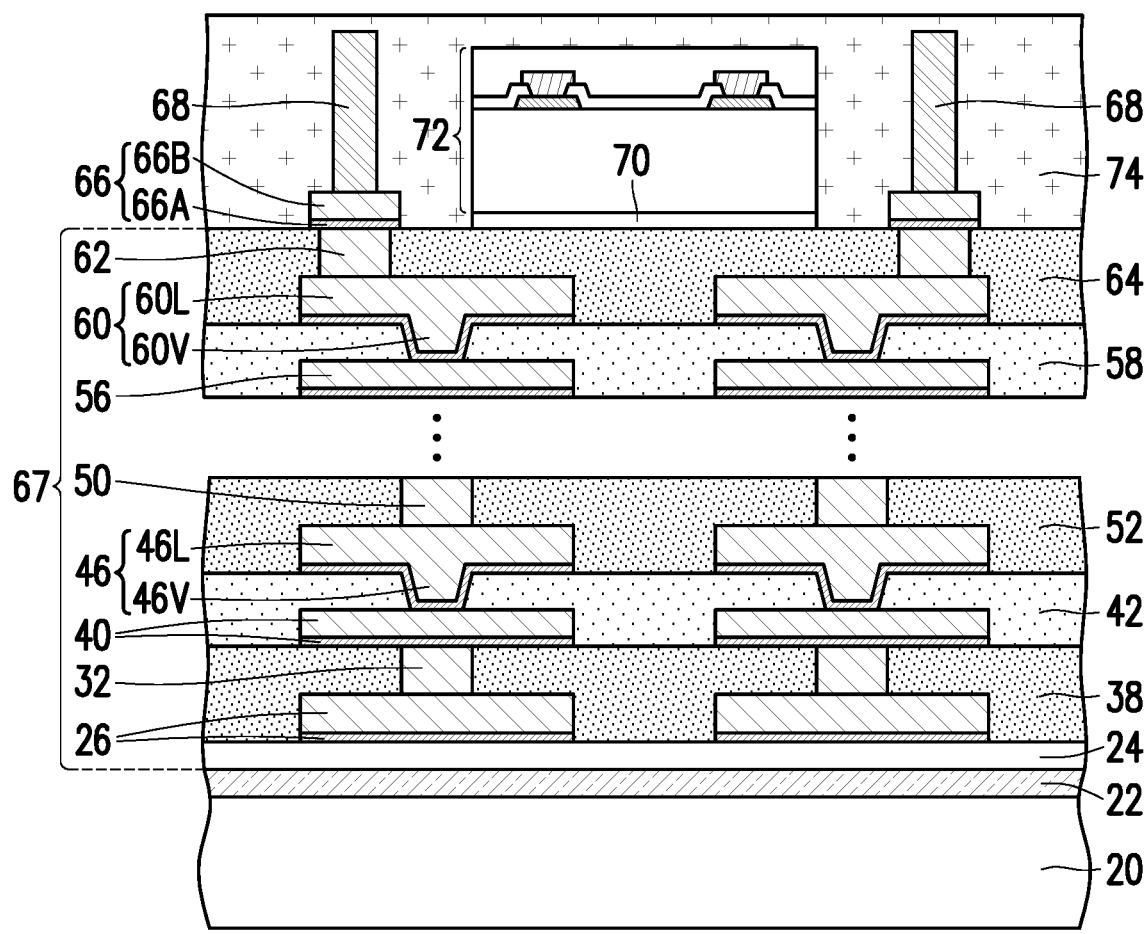
Figure 22:
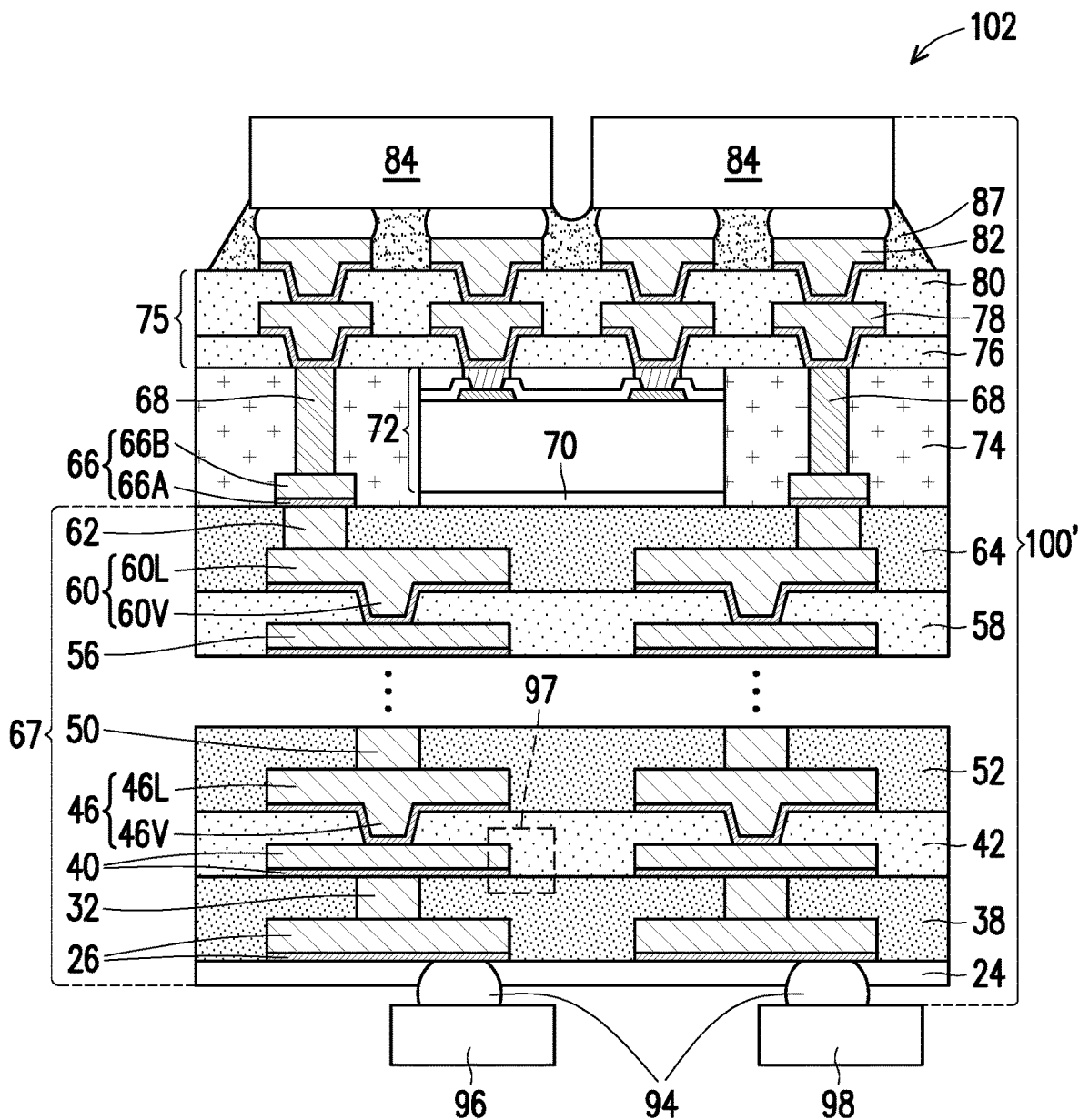
Figure 24:
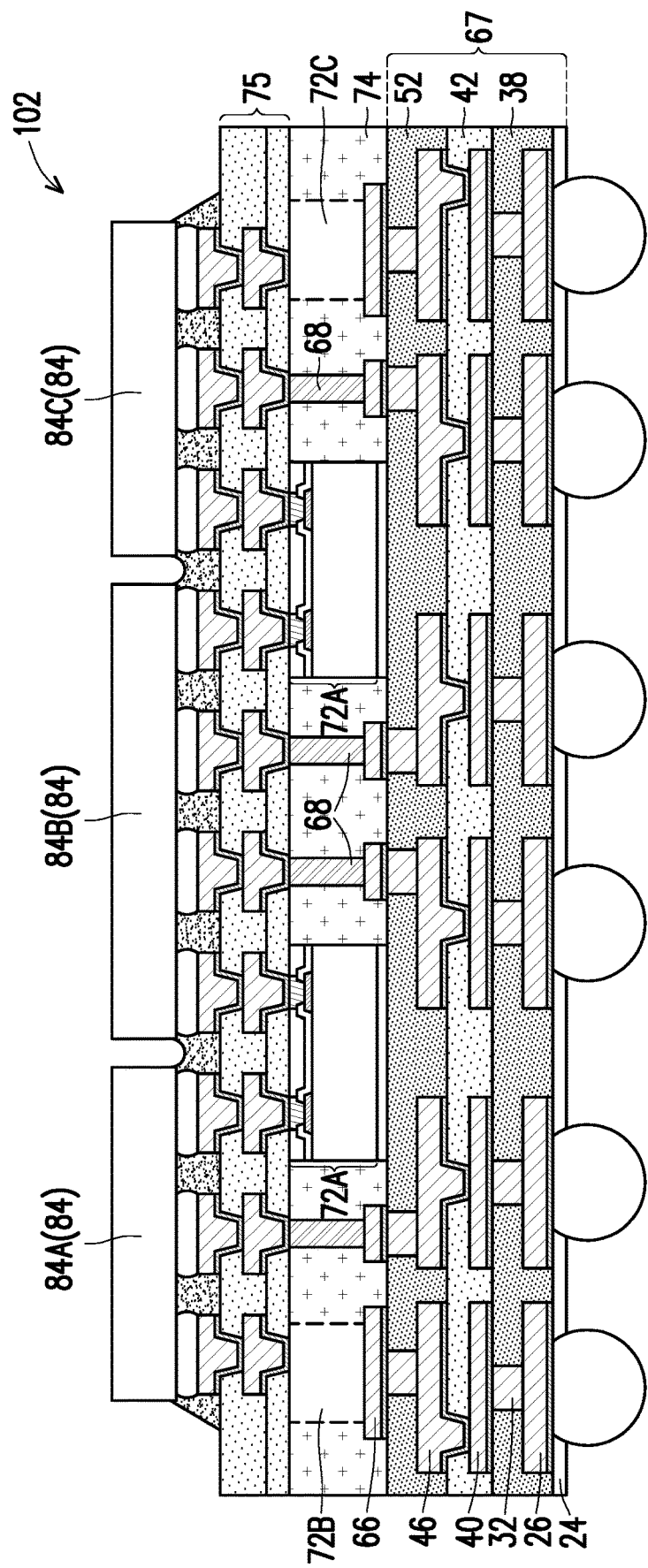
FIGS. 24 and 25 illustrate the cross-sectional views of some package in accordance with some embodiments.
Figure 25:
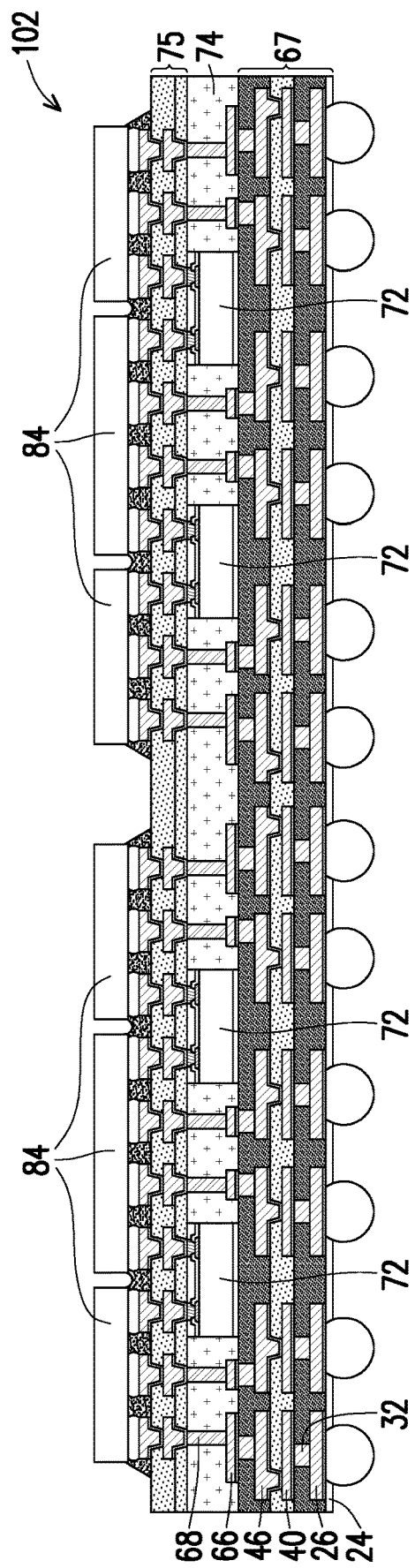

Next, referring to FIG. 16, package components 72 are attached to dielectric layer 64, for example, through die-attach film 70 (an adhesive film). The respective process is illustrated as process 222 in the process flow 200 shown in FIG. 27. The illustrated package component 72 represents a plurality of package components, for example, as shown in FIGS. 24 and 25. The bonded package components include, and are not limited to, bridge dies, logic dies, passive devices, Integrated Voltage Regulator (IVR), and the like. The bridge dies may interconnect two or more package components 84 (FIG. 22). The passive devices may be IPDs, which may include capacitors, inductors, resistors, and/or the like, and may be device dies or packages including the device dies.

Next, as also shown in FIG. 16, encapsulant 74 is dispensed and then cured to encapsulate metal posts 68 and package components 72 therein. The respective process is illustrated as process 224 in the process flow 200 shown in FIG. 27. Encapsulant 74 may include a molding compound, a molding underfill, a resin, an epoxy, and/or the like. In accordance with some embodiments, encapsulant 74 includes a base material such as a polymer, epoxy, resin, or the like, and filler particles in the base material.

Figure 17:
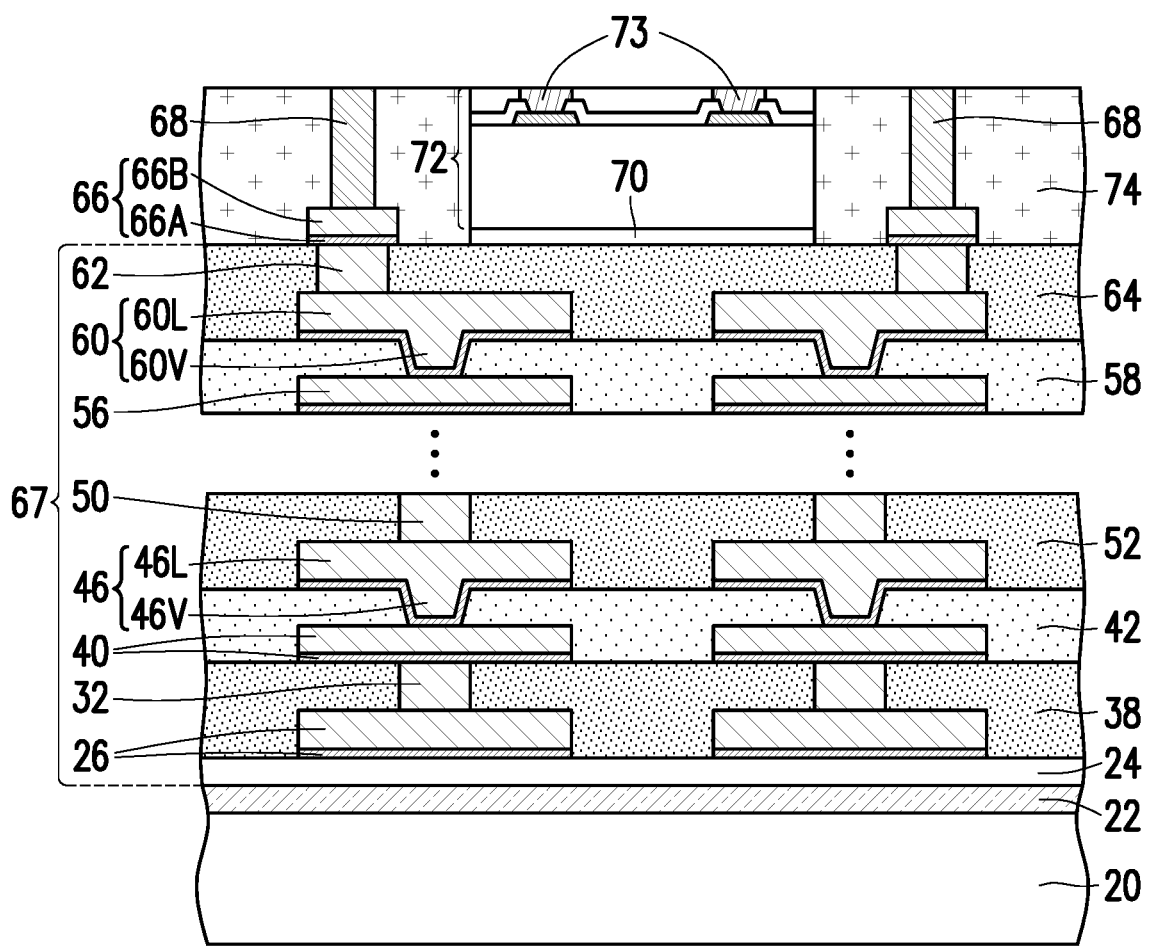

Referring to FIG. 17, after the dispensing and the curing of encapsulant 74, a planarization process such as a CMP process or a mechanical grinding process is performed to remove excess materials, until metal posts 68 and the surface conductive features (such as metal pillars) of package components 72 are exposed. Metal posts 68 are alternatively referred to as through-vias hereinafter.

Figure 18:
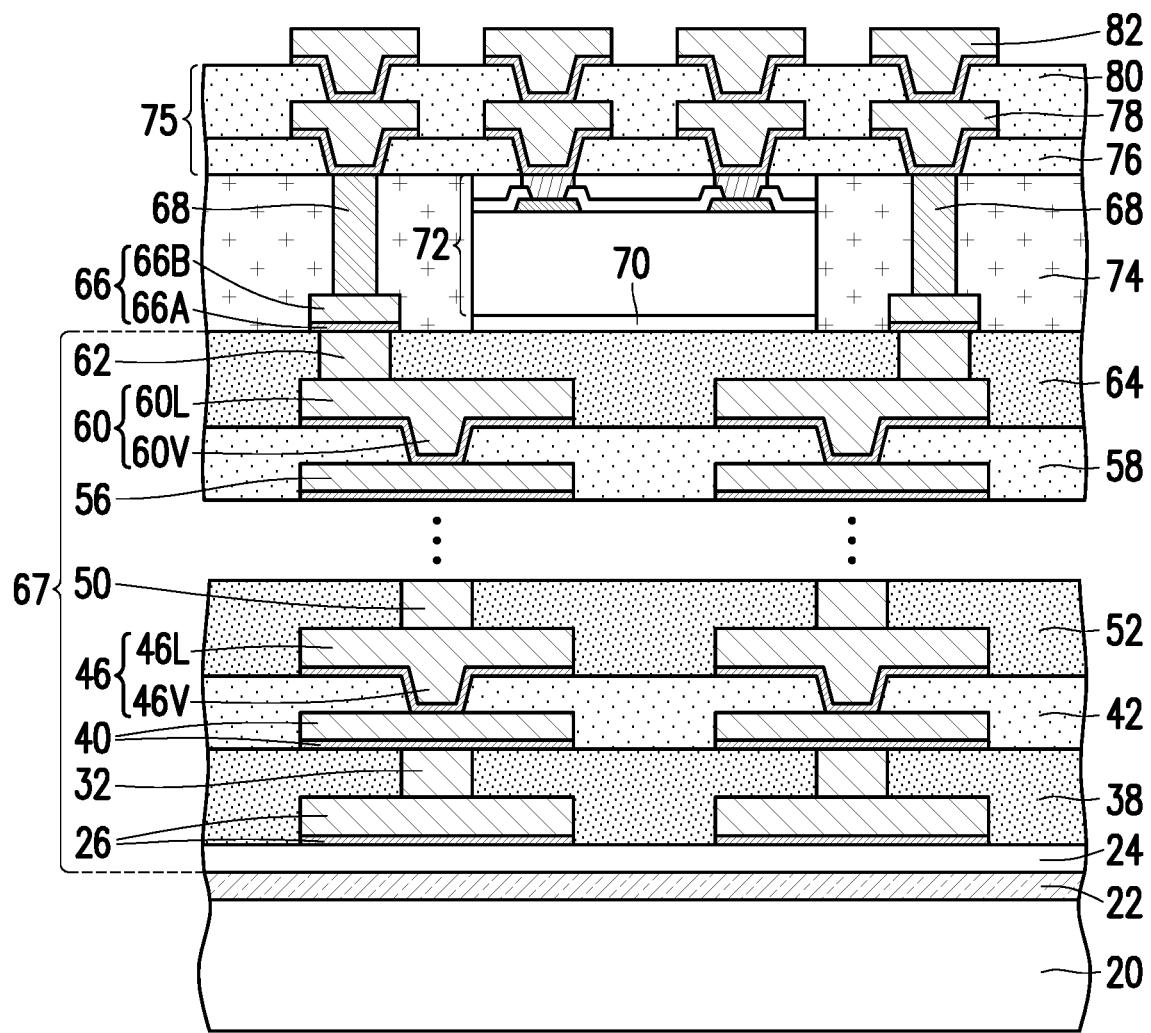

FIG. 18 illustrates the formation of redistribution structure 75, which includes a plurality of dielectric layers such as layers 76 and 80 and a plurality of RDLs such as 78 and 82. The respective process is illustrated as process 226 in the process flow 200 shown in FIG. 27. In accordance with some embodiments, all of the dielectric layers and the RDLs in redistribution structure 75 are formed using the methods similar to the methods for forming dielectric layer 42 and RDLs 46. In accordance with alternative embodiments, redistribution structure 75 also adopts an alternating layout with thicker dielectric layers and thinner dielectric layers (and the corresponding thicker and thinner redistribution lines). Metal bumps may be formed on RDLs 82.

Figure 19:
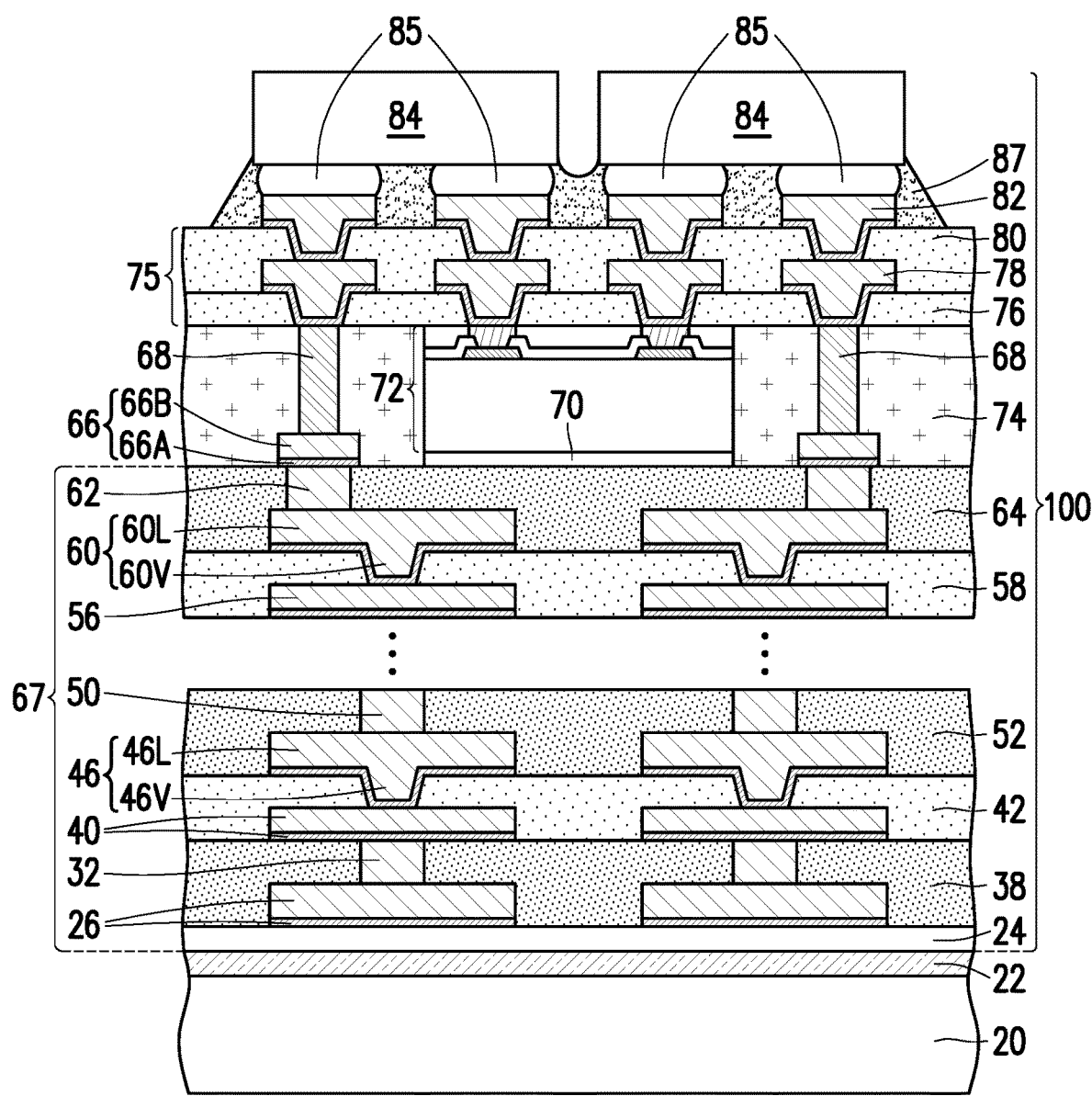

Referring to FIG. 19, package components 84 are bonded to redistribution structure 75 through solder regions 85. The respective process is illustrated as process 228 in the process flow 200 shown in FIG. 27. Underfill 87 is then dispensed and cured. The illustrated package components 84 represent a plurality of package components, as shown in FIGS. 24 and 25. For example, the bonded package components include, and are not limited to, core-device-containing packages (such as System-on-Chip (SoC) packages), memory dies or memory packages (such as High-Bandwidth Memory (HBM) cubes), and the like. In accordance with some embodiments of the present disclosure, each of SoC packages includes a single device die or a plurality of device dies bonded together to form a system. The device dies in the SoC packages may include core device dies such as Central Processing Unit (CPU) dies, Graphic Processing Unit (GPU) dies, Application Specific Integrated Circuit (ASIC) dies, Field Programmable Gate Array (FPGA) dies, or the like, or combinations thereof. The memory packages may include stacked memory dies such as Dynamic Random Access Memory (DRAM) dies, Static Random Access Memory (SRAM) dies, Magnetoresistive Random Access Memory (MRAM) dies, Resistive Random Access Memory (RRAM) dies, or other types of memory dies. Through the description, the structure over release film 22 is referred to as reconstructed wafer 100.

Figure 20:
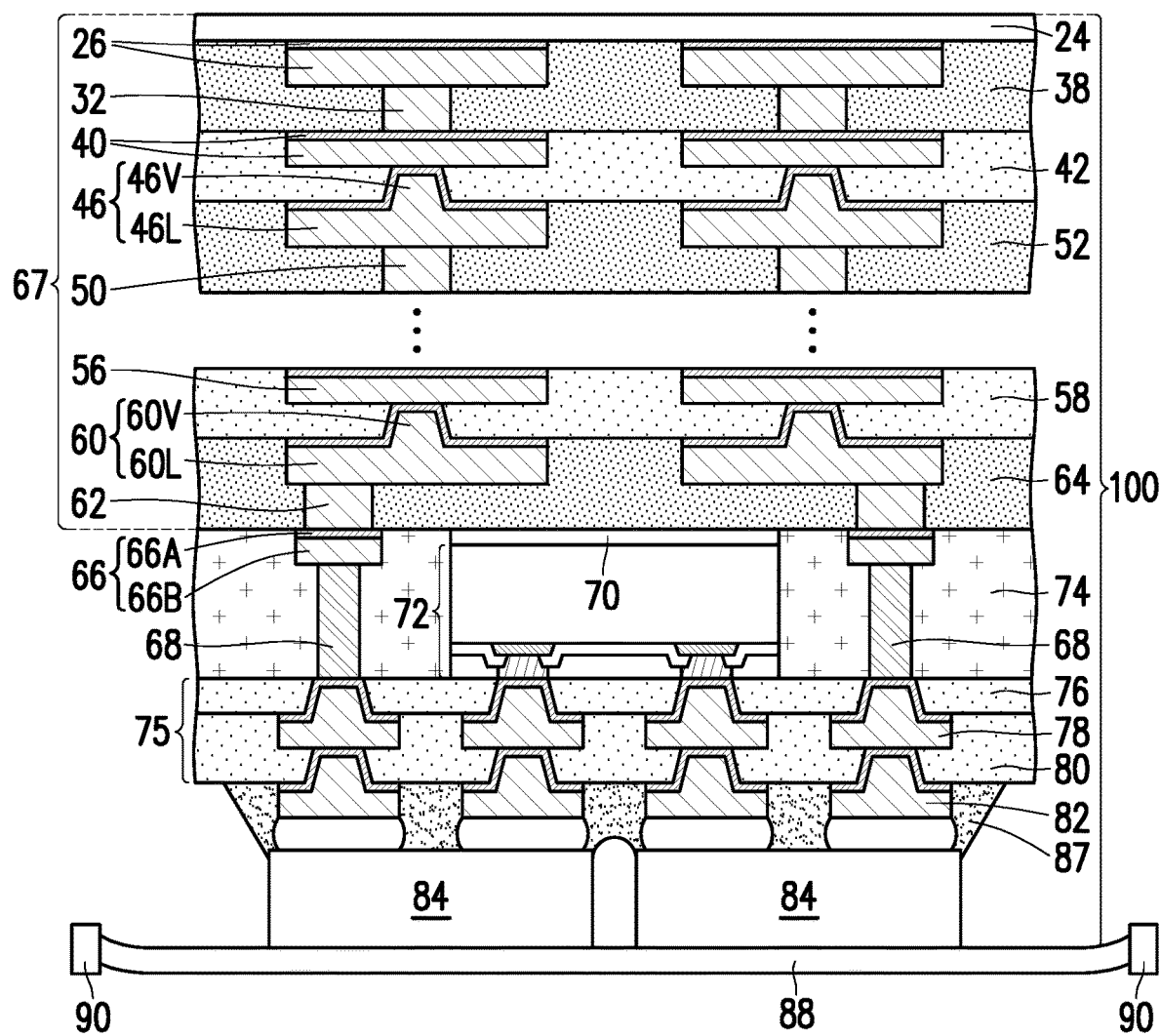

Next, referring to FIG. 20, reconstructed wafer 100 is placed on tape 88, which is attached to frame 90. In accordance with some embodiments of the present disclosure, package components 84 are in contact with tape 88. Next, reconstructed wafer 100 is de-bonded from carrier 20 (FIG. 19) by projecting light on LTHC coating material 22. The respective process is illustrated as process 230 in the process flow 200 shown in FIG. 27. As a result of the light-exposure (such as the laser scanning), release film 22 is decomposed, so that carrier 20 may be lifted off from buffer dielectric layer 24, and hence reconstructed wafer 100 is de-bonded (demounted) from carrier 20.

Referring to FIG. 21, openings 92 are formed in dielectric buffer layer 24, and hence RDLs 26 are exposed. In accordance with some embodiments of the present disclosure, openings 92 are formed through laser drill. The respective process is illustrated as process 232 in the process flow 200 shown in FIG. 27. Pre-solder regions (not shown) may be applied on the exposed portions of RDLs 26.

Next, further referring to FIG. 21, a singulation (die-saw) process is performed to separate reconstructed wafer 100 into individual packages 100', which are identical to each other. The respective process is illustrated as process 234 in the process flow 200 shown in FIG. 27. The singulation may be performed using a blade, or may be performed using a laser beam to perform pre-grooving, so that grooves are formed, and then using a blade to cut through the grooves.

FIG. 22 illustrates the bonding of a singulated package 100' to sockets 96 and connectors 98 through electrical connectors 94, so that package 102 is formed. The respective process is illustrated as process 236 in the process flow 200 shown in FIG. 27. Sockets 96 and connectors 98 may be used for providing power and signal routing between package 100' and external devices.

Figure 23:
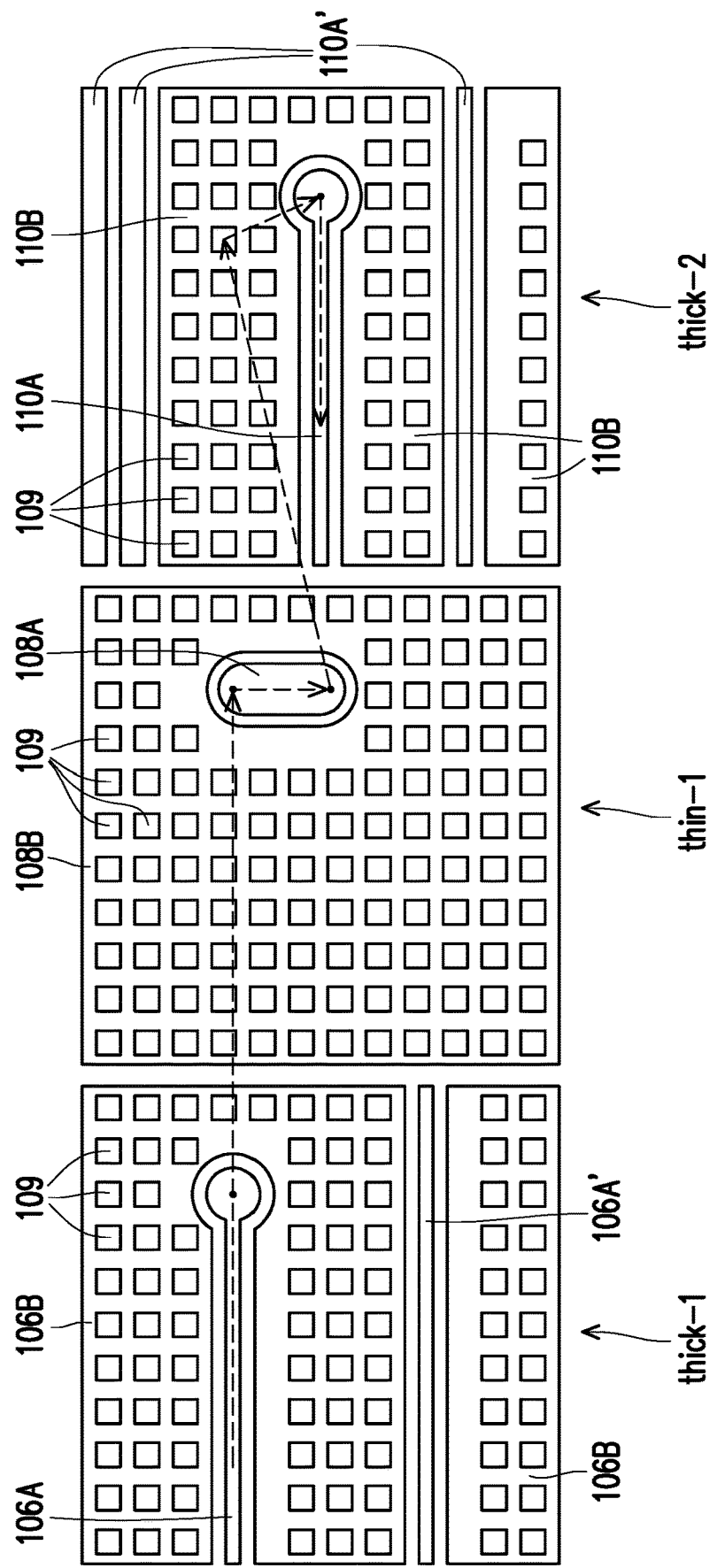
FIG. 23 illustrates a plane view of example layouts of neighboring thick RDLs and thin RDLs in accordance with some embodiments.

FIG. 23 illustrates an example routing scheme and example layouts of thick RDLs (such as 26, 46L, and 60L in FIG. 22) and thin RDLs (such as 40 and 56 in FIG. 22). The thin RDL layer, which is marked as thin-1, is a collection of all of the thin RDLs and dummy pads in the same layer. Each of thick RDL layers, which are marked as thick-1 and thick-2, is a collection of all of the thick RDLs and dummy pads in the same layer. Thin RDL layer thin-1 is sandwiched between thick RDL layers thick-1 and thick-2, wherein thick RDL layer thick-1 may be higher than or lower than thick RDL layer thick-2. In accordance with some embodiments, thin RDL layers such as thin-1 is mainly used for providing Electromagnetic Interface (EMI) shielding to reduce the interference of the signal routing lines between different routing layers such as layers thick-1 and thick-2. The thin RDL layers include metal pads that are used for interconnecting the routing lines in its overlying and underlying RDL layers. The metal pads (such as 108A) in the thin RDL layers are short, and hence the metal pads in the thin RDL layers are not used for lateral routing purpose. The dummy pads (such as dummy pad 108B) are formed in the thin RDL layers, and may be connected to electrical ground for the EMI shielding. The dummy pads 108 may include openings 109 therein to reduce pattern loading effect.

The thick RDL layers include metal pads and routing lines for lateral routing. The RDLs in the thick RDL layer are longer than the metal pads/lines in the thin RDL layers. The metal pads in thick RDL layers are thick, and hence the serial resistance is low, so that the RDLs in the thick RDL layers are suitable for lateral routing purpose. Dummy pads (such as dummy pads 106B and 110B) are also formed in thick RDL layers to further improve the EMI shielding between neighboring RDLs. The dummy pads 106B and 108B may be electrically grounded for the EMI shielding. The dummy pads 106B and 108B may also include openings 109 therein to reduce pattern loading effect.

In accordance with some embodiments, assuming the average length of the RDLs in the thick RDL layer is L1, and the average length of the RDLs in the thin RDL layers is L2, the ratio L1/L2 is greater than 1.0, and may be greater than about 50,000. The ratio L1/L2 may also be in the range between about 1 and about 1,000. Also, all of the RDL lines and pads in the thin RDL layers may have a maximum length of about 300,000 µm (300 mm). On the other hand, at least some, and possibly all, of the RDLs in the thick RDL layers are longer than the maximum length of the RDLs in the thin RDLs. The length of the RDLs in the thick RDL layers may be 2 times, 5 times, 10 times, or 100 times longer than the maximum length of the RDLs in the thin RDLs. Accordingly, all long lateral routing (for example, with distances greater than about 300,000 µm (300 mm) are arranged in the thick RDLs. Long RDLs 106A' and 108A' are also illustrated to show the long routing lines shielded from each other by the dummy metal pads 106B and 108B, respectively.

FIG. 23 illustrates an example signal/power routing scheme. A signal or power is laterally conducted through RDL 106A (in thick RDL thick–1) for a long distance, and is then conducted to metal pad 108A in the thin RDL layer thin–1 through a via (not shown). The signal or power is then conducted to RDL 110A in the thick RDL layer thick-2 through another via (not shown). Metal pad 108A is used for the interconnection between RDL lines 106A and 110A, and is not used for lateral routing. The RDL 110A in thick RDL layer thick-2 may also be long.

The routing scheme shown in FIGS. 22 and 23 may be used for forming high-speed transmission lines (such as differential transmission lines), and may be used for large packages, in which the transmission lines are long, and hence the insertion loss is high. To reduce the insertion loss, the line widths of the transmission lines in the thick RDLs are preferably increased (for example, to be greater than about 15 µm or about 20 µm) so that the resistance of the transmission lines may be reduced. The increase in the width of the transmission lines, however, result in the impedance of the transmission lines to be adversely reduced, causing the mismatch of the impedance values between different parts of the package. In accordance with some embodiments of the present disclosure, height H1 (FIG. 22) between the transmission line and one of the neighboring thin RDL (EMI shielding) layer is increased, so that when the line width of the transmission lines in the thick RDL layers is increased, the impedance is not reduced, and may be kept at a desirable value (For example, 100 ohms). Therefore, alternating thicker dielectric layers and thinner dielectric layers not only reduces the insertion loss of the long horizontal transmission lines, but also balances the requirement of maintaining the impedance of the transmission lines.

FIG. 24 illustrates a package 102 in accordance with some embodiments, with some more details not shown in FIG. 22 illustrated. In accordance with some embodiments, the bonded package components 84 include SoC packages 84A and 84C and HBM 84B. Package components 72A may be bridge dies used for interconnecting package components 84A and 84B, and interconnecting package components 84B and 84C. IVR die 72B and IPD 72C are also illustrated.

FIG. 25 illustrates package 102 in accordance with alternative embodiment. In these embodiments, a plurality of groups of package components 84 are illustrated, each may be interconnected through interconnect structure 75 and the bridge dies in package components 72.

Figure 26:
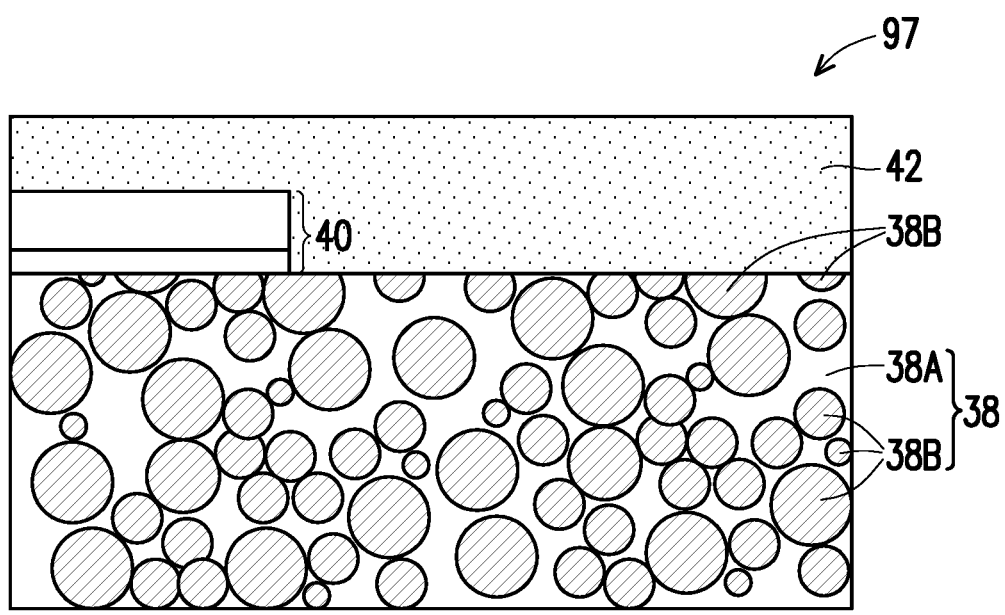
FIG. 26 illustrates an amplified view of a region in a package in accordance with some embodiments.

FIG. 26 illustrates an amplified view of region 97 in FIG. 22, which illustrates a part of thicker dielectric layer 38, a part of thinner dielectric layer 42, and a part of RDL 40. As aforementioned, dielectric layer 38 may include base material 38A such as an epoxy, a resin, a polymer, or the like, and spherical particles 38B. Due to the planarization process, the top parts of some spherical particles 38B may be removed to form partial particles, which have planar top surfaces that are coplanar with the planar top surface of base material 38A. The bottom surface of dielectric layer 42 contacts the planar top surfaces of partial particles 38B and base material 38A. Dielectric layer 42, on the other hand, may be formed of a homogeneous material, and do not include particles therein.

In above-illustrated embodiments, some processes and features are discussed in accordance with some embodiments of the present disclosure to form a three-dimensional (3D) package. Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The embodiments of the present disclosure have some advantageous features. By reducing the thickness of the thin dielectric layers and thin RDL layers, the total number of RDL layers (including thick RDLs and thin RDL layers)

may be increased, and the routing ability is improved. The warpage of the resulting package and reconstructed wafer, however, is not increased since the total thickness of all of the dielectric layers is not increased. The yield of the corresponding process is high since the function of the routing layers may be tested before the device dies are bonded.

In accordance with some embodiments of the present disclosure, a method comprises forming a plurality of dielectric layers comprising forming a first plurality of dielectric layers having first thicknesses; forming a second plurality of dielectric layers having second thicknesses smaller than the first thicknesses, wherein the first plurality of dielectric layers and the second plurality of dielectric layers are laid out alternatingly; and forming a plurality of redistribution lines connected to form a conductive path, wherein the forming the plurality of redistribution lines comprises forming a first plurality of redistribution lines, each being in one of the first plurality of dielectric layers; and forming a second plurality of redistribution lines, each being in one of the second plurality of dielectric layers. In an embodiment, the first plurality of dielectric layers are formed of molding compounds, and the second plurality of dielectric layers are formed of photo-sensitive polymers. In an embodiment, the method further comprises forming a plurality of vias, and the method comprises dispensing one of the first plurality of dielectric layers to embed one of the plurality of vias; and performing a planarization process on the one of the first plurality of dielectric layers and the one of the plurality of vias. In an embodiment, the method further comprises forming a plurality of vias, each in one of the first plurality of dielectric layers, wherein each of the plurality of vias and a respective underling one of the first plurality of redistribution lines are plated sharing a same metal seed layer. In an embodiment, the method further comprises forming a metal pad over a top dielectric layer in the plurality of dielectric layers; forming a metal post over and contacting the metal pad; attaching a device die to the top dielectric layer; and encapsulating the metal pad, the metal post, and the device die in an encapsulant. In an embodiment, ratios of the first thicknesses to the second thicknesses are greater than about 1.5. In an embodiment, the first plurality of redistribution lines have third thicknesses, and the second plurality of redistribution lines have fourth thicknesses smaller than the third thicknesses. In an embodiment, each of the first plurality of dielectric layers comprises a base material and filler particles in the base material, and each of the second plurality of dielectric layers is formed of a homogeneous material.

In accordance with some embodiments of the present disclosure, a method comprises forming a plurality of polymer layers; forming a plurality of molding compound layers, wherein the plurality of polymer layers and the plurality of polymer layers are arranged alternatingly, and wherein each of the plurality of molding compound layers is formed by processes comprising dispensing a molding compound; and performing a planarization process to level a top surface of the molding compound; forming a first plurality of redistribution layers, each in one of the plurality of polymer layers, wherein the first plurality of redistribution layers are electromagnetic shielding layers; and forming a second plurality of redistribution layers, each in one of the plurality of molding compound layers, wherein the second plurality of redistribution layers are horizontal routing layers. In an embodiment, one of the plurality of molding compound layers is thicker than both of a first polymer layer and a second polymer layer in the plurality of polymer layers, with the first polymer layer being overlying and contacting the one of the plurality of molding compound layers, and the second polymer layer being underlying and contacting the one of the plurality of molding compound layers. In an embodiment, the plurality of polymer layers are not planarized by planarization processes. In an embodiment, the package further comprises forming a plurality of vias, each in one of the plurality of molding compound layers, wherein each of the plurality of vias and a corresponding underlying redistribution line are formed in separate plating processes. In an embodiment, each of the plurality of vias is planarized by a corresponding planarization process. In an embodiment, each of the plurality of vias and a corresponding underlying one of second plurality of redistribution layers are formed by sharing a same metal seed layer.

In accordance with some embodiments of the present disclosure, a package comprises a plurality of polymer layers, wherein the plurality of polymer layers have first thicknesses; a plurality of molding compound layers, wherein the plurality of polymer layers and the plurality of molding compound layers are positioned alternatingly, and wherein the plurality of molding compound layers have second thicknesses greater than the first thicknesses; a first plurality of redistribution layers, each in one of the plurality of polymer layers, wherein the first plurality of redistribution layers are electromagnetic shielding layers; and a second plurality of redistribution layers, each in one of the plurality of molding compound layers, wherein the second plurality of redistribution layers are horizontal routing layers. In an embodiment, the first plurality of redistribution layers is thinner than the second plurality of redistribution layers. In an embodiment, the first plurality of redistribution layers comprise first redistribution lines having a maximum length, and the second plurality of redistribution layers comprise second redistribution lines longer than the maximum length. In an embodiment, the first plurality of redistribution layers has third thicknesses, and the second plurality of redistribution layers have fourth thicknesses greater than the third thicknesses. In an embodiment, ratios of the second thicknesses to the first thicknesses are greater than about 1.5. In an embodiment, each of the plurality of molding compound layers comprises a base material and filler particles in the base material, and the plurality of polymer layers are formed of homogeneous materials.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a plurality of dielectric layers comprising:
        forming a first plurality of dielectric layers having first thicknesses;
        forming a second plurality of dielectric layers having second thicknesses smaller than the first thicknesses, wherein the first plurality of dielectric layers and the second plurality of dielectric layers are laid out alternatingly; and forming a plurality of redistribution lines connected to form a conductive path, wherein the forming the plurality of redistribution lines comprises:
- forming a first plurality of redistribution lines, each being in one of the first plurality of dielectric layers; and
- forming a second plurality of redistribution lines, each being in one of the second plurality of dielectric layers.

2. The method of claim 1, wherein the first plurality of dielectric layers are formed of molding compounds, and the second plurality of dielectric layers are formed of photo-sensitive polymers.

3. The method of claim 1 further comprising forming a plurality of vias, and the method comprises:
- dispensing one of the first plurality of dielectric layers to embed one of the plurality of vias; and
- performing a planarization process on the one of the first plurality of dielectric layers and the one of the plurality of vias.

4. The method of claim 1 further comprising forming a plurality of vias, each in one of the first plurality of dielectric layers, wherein each of the plurality of vias and a respective underling one of the first plurality of redistribution lines are plated sharing a same metal seed layer.

5. The method of claim 1 further comprising:
- forming a metal pad over a top dielectric layer in the plurality of dielectric layers;
- forming a metal post over and contacting the metal pad;
- attaching a device die to the top dielectric layer; and
- encapsulating the metal pad, the metal post, and the device die in an encapsulant.

6. The method of claim 1, wherein ratios of the first thicknesses to the second thicknesses are greater than about 1.5.

7. The method of claim 1, wherein the first plurality of redistribution lines have third thicknesses, and the second plurality of redistribution lines have fourth thicknesses smaller than the third thicknesses.

8. The method of claim 1, wherein each of the first plurality of dielectric layers comprises a base material and filler particles in the base material, and each of the second plurality of dielectric layers is formed of a homogeneous material.

9. A method comprising:
- forming a plurality of polymer layers;
- forming a plurality of molding compound layers, wherein the plurality of polymer layers and the plurality of molding compound layers are arranged alternatingly, and wherein each of the plurality of molding compound layers is formed by processes comprising:
  - dispensing a molding compound; and
  - performing a planarization process to level a top surface of the molding compound;
- forming a first plurality of redistribution layers, each in one of the plurality of polymer layers, wherein the first plurality of redistribution layers are electromagnetic shielding layers; and
- forming a second plurality of redistribution layers, each in one of the plurality of molding compound layers, wherein the second plurality of redistribution layers are horizontal routing layers, and wherein each of the first plurality of redistribution layers is thinner than an immediately overlying one and an immediately underlying one of the second plurality of redistribution layer.

10. The method of claim 9, wherein one of the plurality of molding compound layers is thicker than both of a first polymer layer and a second polymer layer in the plurality of polymer layers, with the first polymer layer being overlying and contacting the one of the plurality of molding compound layers, and the second polymer layer being underlying and contacting the one of the plurality of molding compound layers.

11. The method of claim 9, wherein the plurality of polymer layers are not planarized by planarization processes.

12. The method of claim 9 further comprising forming a plurality of vias, each in one of the plurality of molding compound layers, wherein each of the plurality of vias and a corresponding underlying redistribution line are formed in separate plating processes.

13. The method of claim 12, wherein each of the plurality of vias is planarized by a corresponding planarization process.

14. The method of claim 12, wherein each of the plurality of vias and a corresponding underlying one of the second plurality of redistribution layers are formed by sharing a same metal seed layer.

15. A method comprising:
- forming a first redistribution line;
- forming a first via over and contacting the first redistribution line;
- encapsulating the first via and the first redistribution line in a first molding compound;
- planarizing the first molding compound to reveal the first via;
- forming a second redistribution line over and contacting the first via;
- forming a first photo-sensitive dielectric layer over the first molding compound;
- patterning the first photo-sensitive dielectric layer to form a via opening, wherein the first redistribution line is revealed through the via opening;
- forming a third redistribution line and a second via, with a plating process being used, wherein the via fills the via opening; and
- encapsulating the third redistribution line in a second molding compound.

16. The method of claim 15 further comprising:
- forming a third via, wherein the second molding compound also encapsulates the third via therein; and
- planarizing the second molding compound to reveal the third via.

17. The method of claim 16 further comprising forming a second photo-sensitive dielectric layer over and contacting the second molding compound.

18. The method of claim 15, wherein the first redistribution line is thicker than the second redistribution line.

19. The method of claim 15, wherein no planarization process is performed on the first photo-sensitive dielectric layer.

20. The method of claim 15, wherein the first molding compound comprises a base material and filler particles in the base material, and wherein the first photo-sensitive dielectric layer comprises a homogenous material.

\* \* \* \* \*